US010425095B1

(12) United States Patent
Price

(10) Patent No.: US 10,425,095 B1
(45) Date of Patent: Sep. 24, 2019

(54) MULTIPLE-BIT PARALLEL SUCCESSIVE APPROXIMATION (SA) FLASH ANALOG-TO-DIGITAL CONVERTER (ADC) CIRCUITS

(71) Applicant: QUALCOMM Incorporated, San Diego, CA (US)

(72) Inventor: Burt Lee Price, Apex, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/113,619

(22) Filed: Aug. 27, 2018

(51) Int. Cl.
*H03M 1/12* (2006.01)
*H03M 1/14* (2006.01)
*H03M 1/36* (2006.01)
*H03M 7/16* (2006.01)

(52) U.S. Cl.
CPC ............. *H03M 1/14* (2013.01); *H03M 1/365* (2013.01); *H03M 7/165* (2013.01)

(58) Field of Classification Search
CPC .............................. H03M 1/14; H03M 1/365
USPC ............... 341/144, 155, 122, 159, 163, 156
See application file for complete search history.

(56) References Cited

U.S. PATENT DOCUMENTS

| 4,965,579 | A |   | 10/1990 | Liu et al. |
|---|---|---|---|---|
| 4,994,806 | A |   | 2/1991 | Yun-Tae |
| 5,068,662 | A |   | 11/1991 | Guddanti et al. |
| 5,387,914 | A | * | 2/1995 | Mangelsdorf ......... H03M 1/069 341/118 |
| 5,420,587 | A | * | 5/1995 | Michel ................... H03M 1/204 341/156 |
| 5,455,583 | A |   | 10/1995 | Stryjewski |
| 5,691,722 | A |   | 11/1997 | Wang |
| 6,927,712 | B2 |   | 8/2005 | Wei |
| 7,265,704 | B1 |   | 9/2007 | Shakya |
| 7,573,922 | B2 |   | 8/2009 | Kamatani et al. |
| 8,884,799 | B2 |   | 11/2014 | Price et al. |
| 8,902,093 | B1 |   | 12/2014 | Leuciuc et al. |

(Continued)

OTHER PUBLICATIONS

Chande, Vinay et al., "On Neural Networks for Analog to Digital Conversion," IEEE Transactions on Neural Networks, vol. 6, No. 5, Sep. 1995, pp. 1269-1274.

(Continued)

*Primary Examiner* — Peguy Jean Pierre
(74) *Attorney, Agent, or Firm* — W&T/Qualcomm

(57) ABSTRACT

Multiple-bit parallel successive approximation (SA) Flash analog-to-digital converter (ADC) circuits are disclosed. In one aspect, a multiple-bit parallel SA Flash ADC circuit includes a digital-to-analog converter (DAC) circuit that receives reference voltage and trial bit codes, and generates DAC analog signals. The SA Flash ADC circuit includes parallel comparator stages, each including one or more comparator circuits equal to two (2) raised to a number of digital bits of the corresponding parallel comparator stage, quantity minus one (1). Each comparator circuit receives an analog input signal and corresponding DAC analog signal, and generates a digital signal. The digital signal of each comparator circuit is logic high if the analog input signal has a greater voltage than the corresponding DAC analog signal, and logic low if the analog input signal has a smaller voltage. The digital signals corresponding to each parallel comparator stage are used to generate a digital output signal.

22 Claims, 8 Drawing Sheets

(56) References Cited

U.S. PATENT DOCUMENTS

| | | |
|---|---|---|
| 8,907,832 B2 | 12/2014 | Price et al. |
| 9,124,296 B2 | 9/2015 | Dempsey |
| 9,178,524 B1 | 11/2015 | Lee et al. |
| 9,236,878 B2 | 1/2016 | Bogner et al. |
| 9,425,814 B1 | 8/2016 | Verma |
| 9,432,035 B2 | 8/2016 | Vyas et al. |
| 9,450,596 B2 | 9/2016 | Kim et al. |
| 9,536,497 B2 | 1/2017 | Zhang et al. |
| 9,660,660 B1 | 5/2017 | Beukema et al. |
| 2004/0113826 A1* | 6/2004 | Whittaker ............ H03M 1/1047 341/156 |
| 2013/0169454 A1* | 7/2013 | Debnath ............... H03M 1/145 341/110 |
| 2013/0222330 A1 | 8/2013 | Kern et al. |

OTHER PUBLICATIONS

Kolluri, Matt, "A Multi-Step Parallel 10b 1.5 μs ADC," 1984 IEEE International Solid-State Circuits Conference (ISSCC 84), Digest of Technical Papers, vol. 27, Feb. 22, 1984, pp. 60-61 and 316-317.
Lin, Chi-Sheng et al., "A New Successive Approximation Architecture for Low-Power Low-Cost CMOS A/D Converter," IEEE Journal of Solid-State Circuits, vol. 38, No. 1, Jan. 2003, pp. 54-62.
Pelgrom, Marcel J. M., "8.10.3 Time-related Conversion," Analog-to-digital Conversion, Dordrecht, New York, Springer, 2010, pp. 316.

\* cited by examiner

MULTIPLE-BIT PARALLEL SUCCESSIVE APPROXIMATION (SA) FLASH ANALOG-TO-DIGITAL CONVERTER (ADC) CIRCUITS

BACKGROUND

I. Field of the Disclosure

The technology of the disclosure relates generally to analog-to-digital converter (ADC) circuits, and particularly to successive approximation (SA) Flash ADC circuits.

II. Background

Processor-based systems employ analog-to-digital conversion of signals in connection with performing various functions. One way to achieve such analog to digital conversion is by using a Flash analog-to-digital converter (ADC) circuit. The operation of a Flash ADC circuit involves paralleling multiple comparators to perform comparisons of an input voltage signal to a series of analog signals generated in parallel from a reference voltage during a conversion process. In particular, each comparator in a Flash ADC circuit operates asynchronously such that each comparison is performed without reference to a clock signal. A Flash ADC circuit uses the result of each comparison of the input voltage signal to the analog signals to generate a final value of a digital output signal.

For example, a conventional Flash ADC circuit employs $2^N-1$ comparator circuits, wherein N is a number of bits in the digital output signal. Additionally, a reference voltage is divided into $2^N-1$ generated analog signals that are distributed across the range of the reference voltage. Each analog signal is provided to one input of a corresponding comparator circuit, and an input analog signal is provided to another input of each comparator circuit. In this manner, for each comparator circuit, if the generated analog signal has a voltage greater than the input analog signal, the output of the corresponding comparator circuit has a logic low "0" value. Conversely, if the generated analog signal has a voltage less than the input analog signal, the output of the corresponding comparator circuit has a logic high "1" value. The output signal of each comparator circuit is used to create a digital output signal that is a digital representation of the input voltage signal.

In this regard, a conventional Flash ADC circuit has a relatively fast conversion time. However, as conventional Flash ADC circuits are designed to generate digital output signals with a greater number of bits (i.e., a higher number of bits N), the number of circuit elements employed in a conventional Flash ADC circuit increases geometrically resulting in substantially more chip area being used and power being consumed. Thus, it may be advantageous to trade off conversion time for chip area and power reduction.

SUMMARY OF THE DISCLOSURE

Aspects disclosed in the detailed description include multiple-bit parallel successive approximation (SA) Flash analog-to-digital converter (ADC) circuits. In one aspect, a multiple-bit parallel SA Flash ADC circuit is configured to generate a digital output signal having a number of digital bits, wherein the digital output signal is a digital representation to an analog input signal. To perform such a conversion, the multiple-bit parallel SA Flash ADC circuit includes a multiple-output digital-to-analog converter (DAC) circuit that receives a reference voltage, and uses the reference voltage and the digital bits generated by parallel comparator stages of a system compare circuit to generate multiple DAC analog signals. Each of the parallel comparator stages includes a number of comparator circuits equal to two (2) raised to a number of digital output bits of the corresponding parallel comparator stage, quantity minus one (1). Each comparator circuit receives the analog input signal and a corresponding DAC analog signal, and generates a digital signal based on comparing the analog input signal and the DAC analog signal. In particular, the digital signal of each comparator has a logic high value if the analog input signal has a greater voltage than the corresponding DAC analog signal, and has a logic low value if the analog input signal has a smaller voltage than the corresponding DAC analog signal. The system compare circuit uses the digital signals from the comparator circuits of each parallel comparator stage to generate digital bits corresponding to each parallel comparator stage, wherein the one or more digital bits collectively generate the digital output signal. In examples disclosed herein, the multiple-bit parallel SA Flash ADC circuit has a similar conversion time as a conventional Flash ADC circuit would have for the same number of digital bits.

In this regard in one exemplary aspect, a multiple-bit parallel SA Flash ADC circuit is provided. The multiple-bit parallel SA Flash ADC circuit comprises a DAC circuit configured to receive a reference voltage, and generate a plurality of DAC analog signals, wherein each DAC analog signal is based on the reference voltage. The multiple-bit parallel SA Flash ADC circuit further comprises a system compare circuit comprising a plurality of parallel comparator stages. Each parallel comparator stage of the plurality of parallel comparator stages comprises one or more comparator circuits, wherein the one or more comparator circuits of each parallel comparator stage is equal to two (2) raised to a number of digital bits of the corresponding parallel comparator stage, quantity minus one (1). Each comparator circuit of the one or more comparator circuits is configured to receive an analog input signal, receive a corresponding DAC analog signal, and generate a digital signal. The digital signal has a logic high value if the analog input signal has a greater voltage than the corresponding DAC analog signal, and the digital signal has a logic low value if the analog input signal has a smaller voltage than the corresponding DAC analog signal. The system compare circuit is configured to generate one or more digital bits corresponding to each parallel comparator stage based on each corresponding digital signal, wherein the one or more digital bits collectively generate a digital output signal that is a digital representation of the analog input signal.

In another exemplary aspect, a multiple-bit parallel SA Flash ADC circuit is provided. The multiple-bit parallel SA Flash ADC circuit comprises a means for converting a digital value into an analog value configured to receive a reference voltage, and generate a plurality of DAC analog signals, wherein each DAC analog signal is based on the reference voltage. The multiple-bit parallel SA Flash ADC circuit further comprises a means for generating digital bits comprising a plurality of means for comparing values in parallel. Each means for comparing values in parallel comprises a number of means for comparing, wherein the number of means for comparing of each means for comparing values in parallel is equal to two (2) raised to a number of digital bits of the corresponding means for comparing values in parallel, quantity minus one (1). Each means for comparing is configured to receive an analog input signal, receive a corresponding DAC analog signal, and generate a digital signal. The digital signal has a logic high value if the analog input signal has a greater voltage than the corresponding DAC analog signal, and the digital signal has a logic low value if the analog input signal has a smaller voltage than the corresponding DAC analog signal. The means for generating digital bits is configured to generate one or more digital bits corresponding to each means for comparing values in parallel, wherein the one or more digital bits collectively generate a digital output signal that is a digital representation of the analog input signal.

In another exemplary aspect, a method for converting an analog input signal into a digital output signal, wherein multiple digital bits of the digital output signal are determined in parallel, is provided. The method comprises receiving a reference voltage, and generating a plurality of DAC analog signals, wherein each DAC analog signal is based on the reference voltage. The method further comprises receiving the analog input signal, and generating one or more digital signals in a plurality of parallel comparator stages. Each digital signal is generated by comparing the analog input signal to a corresponding DAC analog signal, wherein each digital signal has a logic high value if the analog input signal has a greater voltage than the corresponding DAC analog signal, and each digital signal has a logic low value if the analog input signal has a smaller voltage than the corresponding DAC analog signal. The method further comprises generating one or more digital bits corresponding to each parallel comparator stage based on the one or more digital signals of the corresponding parallel comparator stage, wherein the one or more digital bits collectively generate a digital output signal that is a digital representation of the analog input signal.

DETAILED DESCRIPTION

Figure 1:
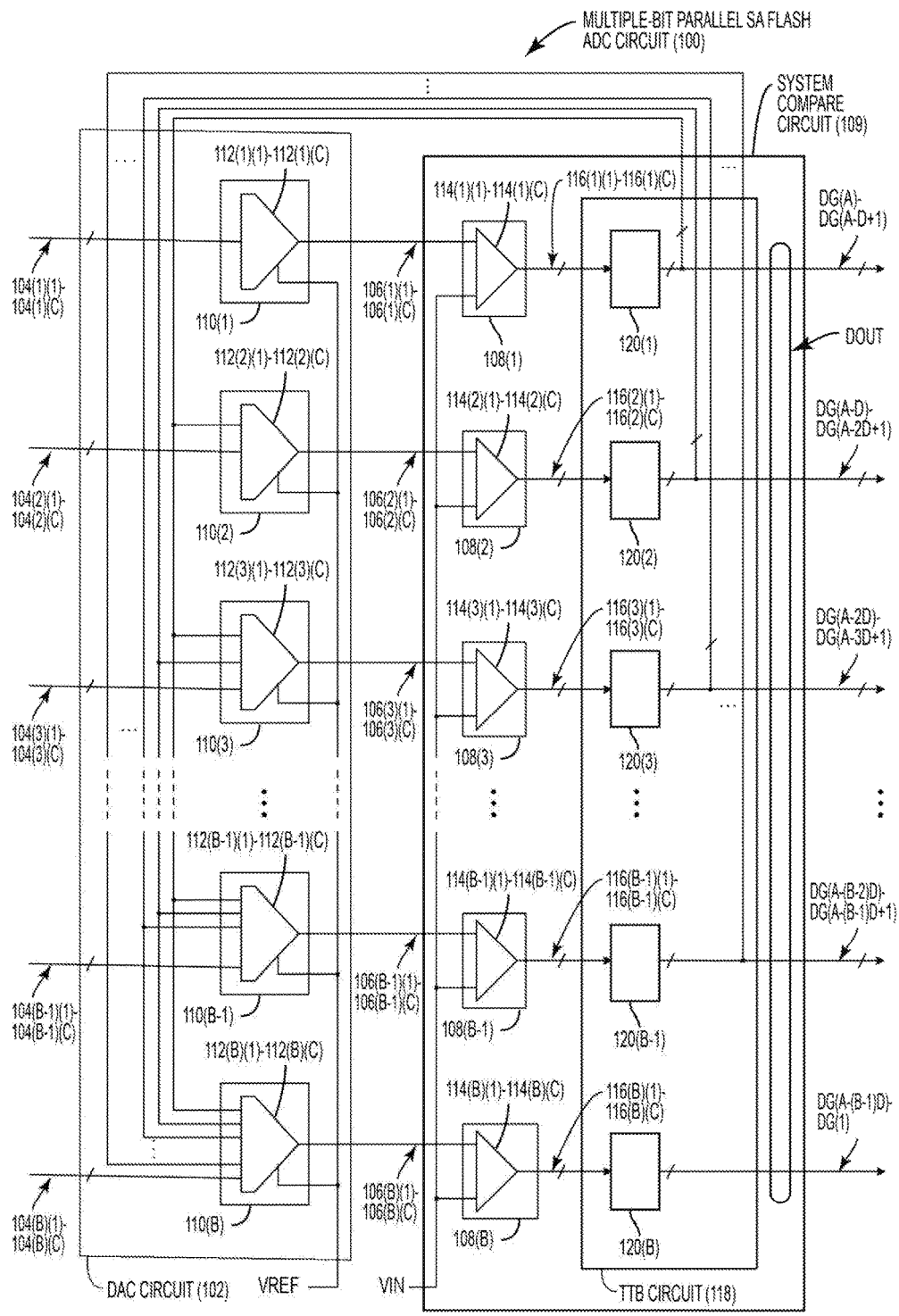
FIG. 1 is a circuit diagram of an exemplary multiple-bit parallel successive approximation (SA) Flash analog-to-digital converter (ADC) circuit configured to convert an analog input signal into a digital output signal, wherein multiple bits of the digital output signal are generated in parallel.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include multiple-bit parallel successive approximation (SA) Flash analog-to-digital converter (ADC) circuits. In one aspect, a multiple-bit parallel SA Flash ADC circuit is configured to generate a digital output signal having a number of digital bits, wherein the digital output signal is a digital representation to an analog input signal. To perform such a conversion, the multiple-bit parallel SA Flash ADC circuit includes a multiple-output digital-to-analog converter (DAC) circuit that receives a reference voltage, and uses the reference voltage and the digital bits generated by parallel comparator stages of a system compare circuit to generate multiple DAC analog signals. Each of the parallel comparator stages includes one or more comparator circuits equal to two (2) raised to a number of digital output bits of the corresponding parallel comparator stage, quantity minus one (1). Each comparator circuit receives the analog input signal and a corresponding DAC analog signal, and generates a digital signal based on comparing the analog input signal and the DAC analog signal. In particular, the digital signal of each comparator has a logic high value if the analog input signal has a greater voltage than the corresponding DAC analog signal, and has a logic low value if the analog input signal has a smaller voltage than the corresponding DAC analog signal. The system compare circuit uses the digital signals from the one or more comparator circuits of each parallel comparator stage to generate digital bits corresponding to each parallel comparator stage, wherein the one or more digital bits collectively generate the digital output signal. In examples disclosed herein, the multiple-bit parallel SA Flash ADC circuit has a similar conversion time as a conventional Flash ADC circuit would have for the same number of digital bits.

In this regard, FIG. 1 is a circuit diagram of an exemplary multiple-bit parallel SA Flash ADC circuit 100 configured to convert an analog input signal VIN into a digital output signal DOUT having digital bits DG(A)-DG(1), wherein a number of the digital bits DG(A)-DG(1) are generated in parallel. In aspects described herein, the digital bit DG(A) (e.g., the highest numbered digital bit DG) is a most significant bit (MSB) of the digital output signal DOUT, and the digital bit DG(1) (e.g., the lowest numbered digital bit DG) is a least significant bit (LSB) of the digital output signal DOUT. To perform a conversion, the multiple-bit parallel SA Flash ADC circuit 100 employs a DAC circuit 102 configured to receive a reference voltage VREF and, in this aspect, a plurality of trial bit codes 104(1)(1)-104(B)(C). As discussed in greater detail below, each trial bit code 104(1)(1)-104(B)(C) includes a unique digital bit sequence with defined values for one or more digital bits, and allows for the successive approximation attribute of the multiple-bit parallel SA Flash ADC circuit 100. The DAC circuit 102 is configured to generate DAC analog signals 106(1)(1)-106(B)(C) based on the reference voltage VREF, the trial bit codes 104(1)(1)-104(B)(C), and a subset of the digital bits DG(1)-DG(A) generated by parallel comparator stages 108 (1)-108(B) of a system compare circuit 109. The DAC analog signals 106(1)(1)-106(B)(C) are provided to each corresponding parallel comparator stage 108(1)-108(3). In this aspect, the DAC circuit 102 employs DAC arrays 110(1)-110(B), each of which corresponds to a parallel comparator stage 108(1)-108(B) and includes corresponding single-output DAC circuits 112(1)(1)-112(B)(C). However, as discussed below, the DAC circuit 102 in other aspects may employ one multiple-output DAC circuit instead of the DAC arrays 110(1)-110(B). Also note that the DAC arrays 110(1)-110(B) and their corresponding parallel comparator stages 108(1)-108(B) may each generate differing numbers of respective DAC analog signals 106(1)(1)-106(B)(C) and digital signals.

With continuing reference to FIG. 1, each of the parallel comparator stages 108(1)-108(B) includes the number C of corresponding comparator circuits 114(1)(1)-114(B)(C), wherein C is equal to two (2) raised to a number D of digital bits DG(1)-DG(A) of the corresponding parallel comparator stage 108(1)-108(B), quantity minus one (1) (i.e., $C=(2^D)-1$). In this example, A=B*D, so digital bits DG (A-(B-1) D)-DG(1) has D bits. As used herein, the numbers A, B, C, and D are positive whole integer numbers. For example, if the parallel comparator stage 108(1) corresponds to two (2) digital bits DG(A), DG(A-1) of the digital output signal DOUT, then the parallel comparator stage 108(1) includes three (3) comparator circuits 114(1)(1)-114(1)(3) (e.g., $(2^2)-1=3$). As discussed in detail below, the number D may be the same in one or more parallel comparator stages 108(1)-108(B) such that the number C is the same in the one or more parallel comparator stages 108(1)-108(B) and DAC arrays 110(1)-110(B). Alternatively, the number D may be different in each parallel comparator stage 108(1)-108(B) such that the number C is different in each parallel comparator stage 108(1)-108(B) and DAC array 110(1)-110(B). Each comparator circuit 114(1)(1)-114(B)(C) receives the analog input signal VIN and a corresponding DAC analog signal 106(1)(1)-106(B)(C), and generates a digital signal 116(1)(1)-116(B)(C) based on comparing the analog input signal VIN and the DAC analog signal 106(1)(1)-106(B)(C). In particular, the digital signal 116(1)(1)-116(B)(C) of each comparator circuit 114(1)(1)-114(B)(C) has a logic high "1" value if the analog input signal VIN has a greater voltage than the corresponding DAC analog signal 106(1)(1)-106 (B)(C), and has a logic low "0" value if the analog input signal VIN has a smaller voltage than the corresponding DAC analog signal 106(1)(1)-106(B)(C). The system compare circuit 109 is configured to generate the digital bits DG(1)-DG(A) corresponding to each parallel comparator stage 108(1)-108(B), wherein the digital bits DG(1)-DG(A) collectively generate the digital output signal DOUT. In particular, in this aspect, the system compare circuit 109 includes a thermometer-to-binary converter (TTB) circuit 118 that is configured to receive the digital signals 116(1) (1)-116(3)(C) from the comparator circuits 114(1)(1)-114 (B)(C) of each parallel comparator stage 108(1)-108(B). The TTB circuit 118 is further configured to generate the digital bits DG(1)-DG(A) corresponding to each parallel comparator stage 108(1)-108(B) to generate the digital output signal DOUT.

With continuing reference to FIG. 1, operational details of the multiple-bit parallel SA Flash ADC circuit 100 are now provided. In particular, to convert the analog input signal VIN to the digital output signal DOUT, the parallel comparator stage 108(1) is configured to calculate the D most significant digital bits DG(A)-DG(A-D+1) of the digital output signal DOUT. To calculate the digital bits DG(A)-DG(A-D+1), the trial bit codes 104(1)(1)-104(1)(C) are provided to the DAC array 110(1), wherein the corresponding trial bit codes 104(1)(1)-104(1)(C) each represent a unique sequence of the digital bits DG(A)-DG(A-D+1). Using the trial bit codes 104(1)(1)-104(1)(C) and the reference voltage VREF, the DAC array 110(1) generates the corresponding DAC analog signals 106(1)(1)-106(1)(C). Further, the parallel comparator stage 108(1) compares each of the DAC analog signals 106(1)(1)-106(1)(C) with the analog input signal VIN to generate the corresponding digital signals 116(1)(1)-116(1)(C), which are converted into the digital bits DG(A)-DG(A-D+1) by a stage 120(1) of the TTB circuit 118.

With continuing reference to FIG. 1, it is important to note that the multiple-bit parallel SA Flash ADC circuit 100 is asynchronous (i.e., is not controlled by a clock signal). Rather, each DAC array 110(2)-110(B) is configured to receive the outputs of stages 120(1)-120(B) generated as digital bits DG(1)-DG(A) generated in each previous parallel comparator stage 108(1)-108(B). In this manner, each DAC array 110(2)-110(B) generates the corresponding DAC analog signals 106(2)(1)-106(B)(C) in response to the digital bits DG(1)-DG(A) of the previous parallel comparator stage 108(1)-108(B) stabilizing. In this regard, the parallel comparator stage 108(2) is configured to calculate the next D most significant digital bits DG(A-D)-DG(A-2D+1) of the digital output signal DOUT. To calculate the digital bits DG(A-D)-DG(A-2D+1), the trial bit codes 104(2)(1)-104 (2)(C) are provided to the DAC array 110(2), wherein the trial bit codes 104(2)(1)-104(2)(C) each represent a unique sequence of the digital bits DG(A-D)-DG(A-2D+1). Additionally, the digital bits DG(A)-DG(A-D+1) are also provided to the DAC array 110(2). Using the trial bit codes 104(2)(1)-104(2)(C), the digital bits DG(A)-DG(A-D+1), and the reference voltage VREF, the DAC array 110(2) generates the corresponding DAC analog signals 106(2)(1)- 106(2)(C). Further, the parallel comparator stage 108(2) compares each of the DAC analog signals 106(2)(1)-106(2) (C) with the analog input signal VIN to generate the corresponding digital signals 116(2)(1)-116(2)(C), which are converted into the digital bits DG(A-D)-DG(A-2D+1) by a stage 120(2) of the TTB circuit 118. The sequence above continues for the remaining digital bits DG(A-2D-1)-DG (1) using the remaining DAC arrays 110(3)-110(B), parallel comparator stages 108(3)-108(B), and stages 120(3)-120(B) of the TTB circuit 118.

With continuing reference to FIG. 1, as noted above, the number D may be the same or vary for each parallel comparator stage 108(1)-108(B) such that the number C may also vary for each parallel comparator stage 108(1)- 108(B) and DAC array 110(1)-110(B). For example, the DAC array 110(1), the parallel comparator stage 108(1), and the stage 120(1) may correspond to an M number of MSBs of digital bits DG(1)-DG(A). Thus, the DAC array 110(1) receives trial bit codes 104(1)(1)-104(1)((2^M)-1), includes single-output DAC circuits 112(1)(1)-112(1)((2^M)-1), and generates DAC analog signals 106(1)(1)-106(1)((2^M)-1). Additionally, the parallel comparator stage 108(1) includes (2^M)-1 comparator circuits 114(1)(1)-114(1)((2^M)-1) and generates digital signals 116(1)(1)-116(1)((2^M)-1). The stage 120(1) then generates the M number of MSBs of the digital bits DG(1)-DG(A). The DAC array 110(2), the parallel comparator stage 108(2), and the stage 120(2) correspond to an N number of digital bits within DG(1)-DG(A), while the DAC array 110(3), the parallel comparator stage 108(3), and the stage 120(3) correspond to a P number of digital bits within DG(1)-DG(A). Further, the DAC array 110(B-1), the parallel comparator stage 108(B-1), and the stage 120(B-1) correspond to a Q number of digital bits within DG(1)-DG(A), while the DAC array 110(B), the parallel comparator stage 108(B), and the stage 120(B) correspond to an R number of digital bits within DG(1)-DG(A). Configuring the multiple-bit parallel SA Flash ADC circuit 100 to implement the differing numbers M, N, P, Q, and R provides designers with the ability to customize the level of parallelism with specific granularity based on the needs of a particular application.

Figure 2:
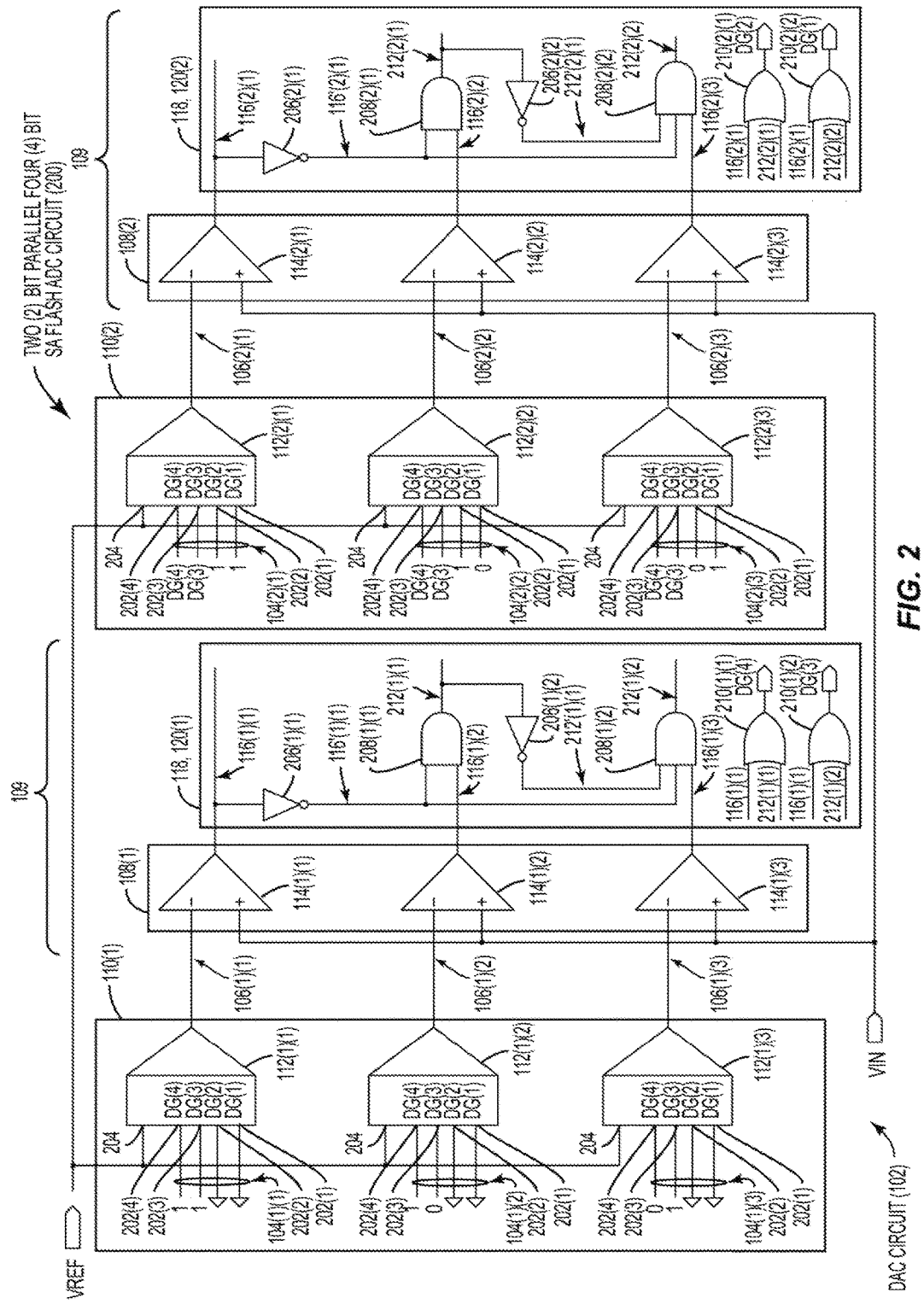
FIG. 2 is a circuit diagram of an exemplary two (2) bit parallel four (4) bit SA Flash ADC circuit configured to convert an analog input signal into a four (4) bit digital output signal that employs a single-output digital-to-analog converter (DAC) circuit corresponding to each comparator circuit.

A specific aspect of the multiple-bit parallel SA Flash ADC circuit 100 of FIG. 1 is now described to provide additional clarification. In this regard, FIG. 2 is a circuit diagram of an exemplary two (2) bit parallel four (4) bit SA Flash ADC circuit 200 configured to convert an analog input signal VIN into a four (4) bit (i.e., digital bits DG(4)-DG(1)) digital output signal DOUT that employs single-output DAC circuits 112(1)(1)-112(2)(3) corresponding to each comparator circuit 114(1)(1)-114(2)(3). The two (2) bit parallel four (4) bit SA Flash ADC circuit 200 includes common elements with the multiple-bit parallel SA Flash ADC circuit 100 of FIG. 1, which are referred to with common element numbers in FIG. 1 and FIG. 2, and thus will not re-described herein.

With continuing reference to FIG. 2, to convert the analog input signal VIN to the digital output signal DOUT, a parallel comparator stage 108(1) is configured to calculate the two (2) most significant digital bits DG(4)-DG(3) of the digital output signal DOUT. To calculate the digital bits DG(4)-DG(3), three (3) trial bit codes 1040)(1)-104(1)(3) are provided to the DAC array 110(1). In particular, the input ports 202(4)-202(3) of the single-output DAC circuit 112(1)(1) receive the trial bit code 104(1)(1) that includes the hit sequence "11". Additionally, the input ports 202(4), 202(3) of the single-output DAC circuit 112(1)(2) receive the trial bit code 104(1)(2) that includes the bit sequence "10" corresponding to the digital hits DG(4), DG(3), and the input ports 202(4), 202(3) of the single-output DAC circuit 112(1)(3) receive the trial bit code 104(1)(3) that includes the bit sequence "01" corresponding to the digital bits DG(4), DG(3). Additionally, the input ports 202(2), 202(1) of each of the single-output DAC circuits 112(1)(1)-112(1)(3) are electrically coupled to ground, which provides a logic low "0" value to each corresponding input port 202(2), 202(1). Each DAC circuit 112(1)(1)-112(1)(3) also includes a voltage input node 204 configured to receive the reference voltage VREF. Using the trial hit codes 104(1)(1)-104(1)(3) and the reference voltage VREF, the DAC array 110(1) generates the corresponding DAC analog signals 106(1)(1)-106(1)(3). In particular, the DAC circuit 102 is configured to generate the DAC analog signals 106(1)(1)-106(1)(3) with corresponding values that are a division of the voltage range between the reference voltage VREF and the ground signal. For example, if the reference voltage VREF is 1.0 V, then the DAC analog signals 106(1)(1)-106(1)(3) are equal to 0.75 V, 0.50 V; and 0.25 V, respectively.

With continuing reference to FIG. 2, each of the DAC analog signals 106(1)(1)-106(1)(3) are provided to each corresponding comparator circuit 114(1)(1)-114(1)(3). In this manner, the parallel comparator stage 108(1) compares each of the DAC analog signals 106(1)(1)-106(1)(3) with the analog input signal VIN to generate the corresponding digital signals 116(1)(1)-116(1)(3). More specifically, the comparator circuit 114(1)(1) generates the digital signal 116(1)(1) by comparing the DAC analog signal 106(1)(1) with the analog input signal VIN, and the comparator circuit 114(1)(2) generates the digital signal 116(1)(2) by comparing the DAC analog signal 106(1)(2) with the analog input signal VIN. Additionally, the comparator circuit 114(1)(3) generates the digital signal 116(1)(3) by comparing the DAC analog signal 106(1)(3) with the analog input signal VIN. For example, if VREF is 1.0 V and if the analog input signal VIN is equal to 0.57 V, while the DAC analog signals 106(1)(1)-106(1)(3) are equal to 0.75 V, 0.5 V, and 0.25 V, respectively, then the digital signal 116(1)(1) has a logic 0 value, the digital signal 116(1)(2) has a logic 1 value, and the digital signal 116(1)(3) has a logic 1 value. The digital signals 116(1)(1)-116(1)(3) are converted into the digital bits DG(4), DG(3) by a stage 120(1) of the TTB circuit 118. For example, digital bits DG(4), DG(3) may have a value of "10". In this example, the possibilities are that all of the DAC analog signals 106(1)(1)-106(1)(3) are "000", "001", "011", or "111" because of how the digital signals 116(1)(1)-116(1)(3) generated by the comparator circuits 114(1)(1)-114(1)(3) generate a thermometer code based on which of the threshold values in the DAC analog signals 106(1)(1)-106(1)(3) the input VIN is greater than. In this regard, the TTB circuit 118 and stage 120(1) generates "00" for digital bits DG(4), DG(3) for comparator outputs of "000" for digital signals 116(1)(1)-116(1)(3); it generates "01" for digital bits DG(4), DG(3) for comparator outputs of "001" for digital signals 116(1)(1)-116(1)(3); it generates "10" for digital bits DG(4), DG(3) for comparator outputs of "011" for digital signals 116(1)(1)-116(1)(3); and it generates "11" for digital bits DG(4), DG(3) for comparator outputs of "111" for digital signals 116(1)(1)-116(1)(3).

For example, with continuing reference to FIG. 2, to generate the digital bits DG(4), DG(3) in this aspect, the stage 120(1) of the TTB circuit 118 employs inverters 206(1)(1), 206(1)(2), AND-based gates 208(1)(1), 208(1)(2) (e.g., AND gates 208(1)(1), 208(1)(2)), and OR-based gates 210(1)(1), 210(1)(2) (e.g., OR gates 210(1)(1), 210(1)(2)). The digital signal 116(1)(1) (e.g., 0 value) is provided to the inverter 206(1)(1) such that the inverter 206(1)(1) generates an inverse digital signal 116'(1)(1) (e.g., 1 value), which is provided to the AND gates 208(1)(1), 208(1)(2). Additionally, the digital signal 116(1)(2) (e.g., 1 value) is provided to the AND gate 208(1)(1). In this example, the AND gate 208(1)(1) generates an intermediary digital signal 212(1)(1) that has a logic high "1" value in this example. The intermediary digital signal 212(1)(1) (e.g., 1 value) provided to the inverter 206(1)(2), wherein the inverter 206(1)(2) generates an inverse intermediary digital signal 212'(1)(1) (e.g., 0 value) that is provided to the AND gate 208(1)(2). The inverse digital signal 116'(1)(1) is also provided to the AND gate 208(1)(2), wherein the AND gate 208(1)(2) generates an intermediary digital signal 212(1)(2) that has a logic high "1" value if the digital signals 116(1)(1), 116(1)(2) each have a logic low "0" value while the digital signal 116(1)(3) has a logic high "1" value, and a logic low "0" value otherwise in this example. The digital signal 116(1)(1) (e.g., 0 value) and the intermediary digital signal 212(1)(1) (e.g., 1 value) are provided to the OR gate 210(1)(1), wherein the OR gate 210(1)(1) generates the digital bit DG(4) (e.g., 1 value) of the digital output signal DG(l). Additionally, the digital signal 116(1)(1) (e.g., 0 value) and the intermediary digital signal 212(0(2) (e.g., 0 value) are provided to the OR gate 210(1)(2), wherein the OR gate 210(1)(2) generates the digital bit DG(3) (e.g., 0 value) of the digital output signal DG(3).

With continuing reference to FIG. 2, a parallel comparator stage 108(2) is configured to calculate the two (2) least significant digital bits DG(2), DG(1) of the digital output signal DOUT in response to the digital bits DG(4), DG(3) settling to a stable value. To calculate the digital bits DG(2), DG(1), three (3) trial bit codes 104(2)(1)-104(2)(3) are provided to the DAC array 110(2), wherein each single-output DAC circuit 112(2)(1)-112(2)(3) includes input ports 202(1)-202(4). Each DAC 112(2)(1)-112(2)(3) also includes a voltage input node 204 configured to receive the reference voltage VREF. The input ports 202(4), 202(3) of each single-output DAC circuit 112(2)(1)-112(2)(3) are configured to receive the generated digital bits DG(4), DG(3). However, the input ports 202(2), 202(1) of the single-output DAC circuit 112(2)(1) receive the trial bit code 104(2)(1) that includes the bit sequence "11" corresponding to the DAC inputs DG(2), DG(1). Additionally, the input ports 202(2), 202(1) of the single-output DAC circuit 112(2)(2) receive the trial bit code 104(2)(2) that includes the bit sequence "10" corresponding to the DAC inputs DG(2), DG(1), and the input ports 202(2), 202(1) of the single-output DAC circuit 112(2)(3) receives the trial bit code 104(2)(3) that includes the bit sequence "01" corresponding to the digital bits DG(2), DG(1). The DAC array 110(2) generates the corresponding DAC analog signals 106(2)(1)-106(2)(3) using the trial bit codes 104(2)(1)-104(2)(3), the reference voltage VREF, and the digital bits DG(1)-DG(4) from the previous parallel stage(s). For example, the DAC analog signals 106(2)(1)-106(2)(3) in this example are equal to 0.6875V, 0.625V, and 0.5625V, respectively.

With continuing reference to FIG. 2, each of the DAC analog signals 106(2)(1)-106(2)(3) are provided to each corresponding comparator circuit 114(2)(1)-114(2)(3). In this manner, the parallel comparator stage 108(2) compares each of the DAC analog signals 106(2)(1)-106(2)(3) with the analog input signal VIN to generate the corresponding digital signals 116(2)(1)-116(2)(3). More specifically, the comparator circuit 114(2)(1) generates the digital signal 116(2)(1) (e.g., logic 0 value) by comparing the DAC analog signal 106(2)(1) (e.g., 0.6875V value) with the analog input signal VIN (0.57V), and the comparator circuit 114(2)(2) generates the digital signal 116(2)(2) (e.g., logic 0 value) by comparing the DAC analog signal 106(2)(2) (e.g., 0.625V value) with the analog input signal VIN. Additionally, the comparator circuit 114(2)(3) generates the digital signal 116(2)(3) (e.g., logic 1 value) by comparing the DAC analog signal 106(2)(3) (e.g., 0.5625V value) with the analog input signal VIN. The digital signals 116(2)(1)-116(2)(3) are converted into the digital bits DG(2), DG(1) by a stage 120(2) of the TTB circuit 118.

For example, with continuing reference to FIG. 2, to generate the digital bits DG(2), DG(1) in this aspect, the stage 120(2) of the TTB circuit 118 employs inverters 206(2)(1), 206(2)(2), AND-based gates 208(2)(1), 208(2)(2) (e.g., AND gates 208(2)(1), 208(2)(2)), and OR-based gates 210(2)(1), 210(2)(2) (e.g., OR gates 210(2)(1), 210(2)(2)). The digital signal 116(2)(1) (e.g., 0 value) is provided to the inverter 206(2)(1) such that the inverter 206(2)(1) generates a complement digital signal 116'(2)(1) (e.g., 1 value), which is provided to the AND gates 208(2)(1), 208(2)(2). Additionally, the digital signal 116(2)(2) (e.g., 0 value) is provided to the AND gate 208(2)(1). In this manner, the AND gate 208(2)(1) generates an intermediary digital signal 212(2)(1) that has a logic high "1" value if the digital signal 116(2)(1) has a logic low "0" value while the digital signal 116(2)(2) has a logic high "1" value. The intermediary digital signal 212(2)(1) (e.g., 0 value) is provided to the inverter 206(2)(2), wherein the inverter 206(2)(2) generates a complement intermediary digital signal 212'(2)(1) (e.g., 1 value) that is provided to the AND gate 208(2)(2). The digital signal 116(2)(3) (e.g., 1 value) is also provided to the AND gate 208(2)(2), wherein the AND gate 208(2)(2) generates an intermediary digital signal 212(2)(2) that has a logic high "1" value if the digital signals 116(2)(1), 116(2) (2) each have a logic low "0" value while the digital signal 116(2)(3) has a logic high "1" value, and a logic low "0" value otherwise. The digital signal 116(2)(1) (e.g., 0 value) and the intermediary digital signal 212(2)(1) (e.g., 0 value) are provided to the OR gate 210(2)(1), wherein the OR gate 210(2)(1) generates the digital bit DG(2) (e.g., 0 value) of the digital output signal DOUT. Additionally, the digital signal 116(2)(1) (e.g., 0 value) and the intermediary digital signal 212(2)(2) (e.g., 1 value) are provided to the OR gate 210(2)(2), wherein the OR gate 210(2)(2) generates the digital bit DG(1) 1 value) of the digital output signal DOUT, such that the digital output signal DOUT in this example equals "1001."

Figure 3:
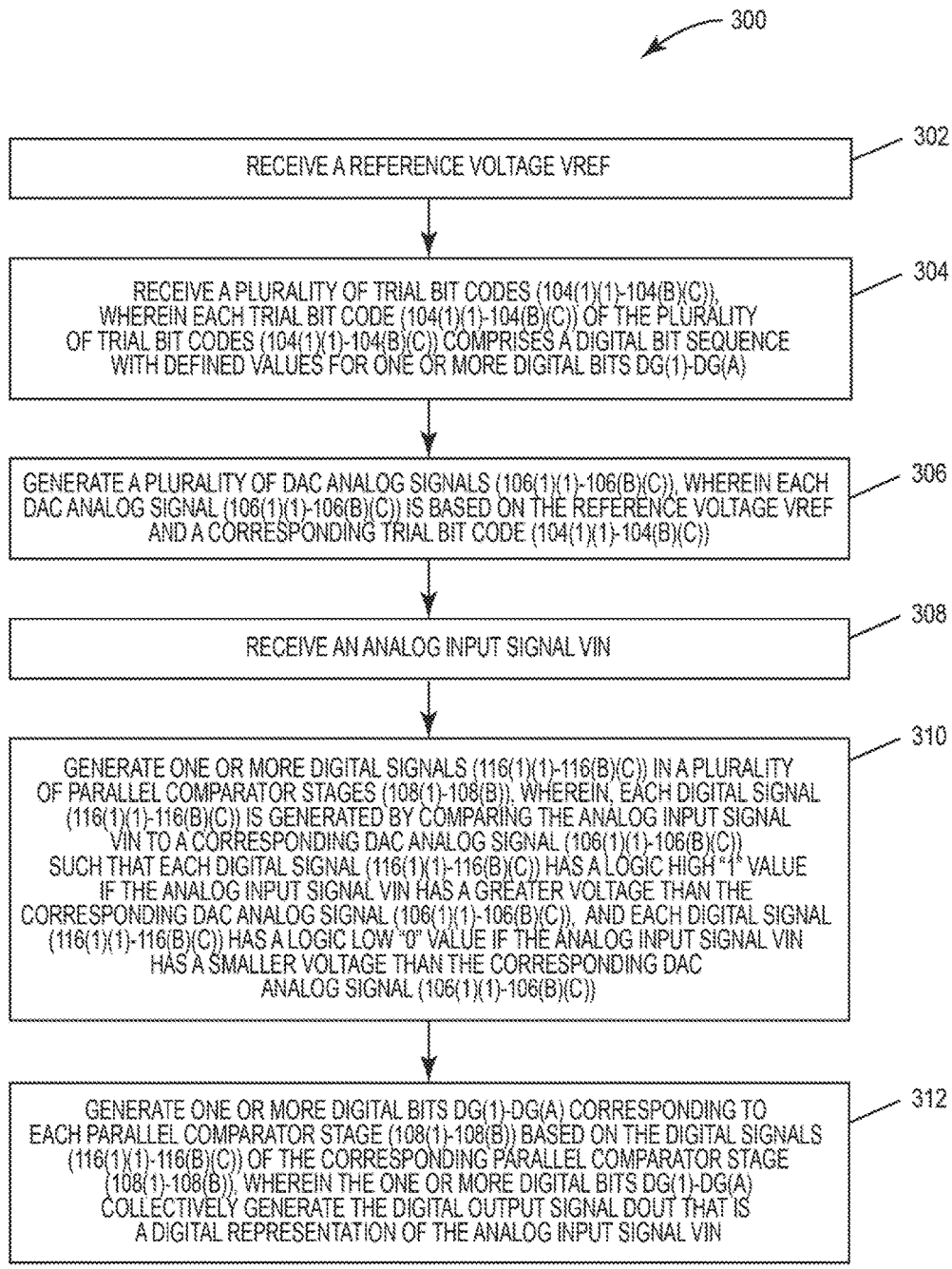
FIG. 3 is a flowchart illustrating an exemplary process that can be performed by the multiple-bit parallel SA Flash ADC circuit of FIG. 1 to convert an analog input signal into a digital output signal.

FIG. 3 illustrates an exemplary process 300 used by the multiple-bit parallel SA Flash ADC circuit 100 of FIG. 1 to convert the analog input signal VIN into the digital output signal DOUT. The process 300 includes receiving a reference voltage VREF (block 302). The process 300 also includes receiving a plurality of trial bit codes 104(1)(1)-104(B)(C), wherein each trial bit code 104(1)(1)-104(B)(C) of the plurality of trial bit codes 104(1)(1)-104(B)(C) comprises a digital bit sequence with defined values for one or more digital bits DG(1)-DG(A) (block 304). Additionally, the process 300 includes generating a plurality of DAC analog signals 106(1)(1)-106(B)(C), wherein each DAC analog signal 106(1)(1)-106(B)(C) is based on the reference voltage VREF and a corresponding trial bit code 104(1)(1)-104(B)(C) (block 306). The process 300 also includes receiving an analog input signal VIN (block 308). The process 300 further includes generating one or more digital signals 116(1)(1)-116(B)(C) in a plurality of parallel comparator stages 108(1)-108(B) (block 310). As described above, each digital signal 116(1)(1)-116(B)(C) is generated by comparing the analog input signal VIN to a corresponding DAC analog signal 106(1)(1)-106(B)(C) such that each digital signal 116(1)(1)-116(B)(C) has a logic high "1" value if the analog input signal VIN has a greater voltage than the corresponding DAC analog signal 106(1)(1)-106(B)(C), and each digital signal 116(1)(1)-116(B)(C) has a logic low "0" value if the analog input signal VIN has a smaller voltage than the corresponding DAC analog signal 106(1)(1)-106 (B)(C). The process 300 also includes generating one or more digital bits DG(1)-DG(A) corresponding to each parallel comparator stage 108(1)-108(B) based on the digital signals 116(1)(1)-116(B)(C) of the corresponding parallel comparator stage 108(1)-108(B), wherein the one or more digital bits DG(1)-DG(A) collectively generate the digital output signal DOUT that is a digital representation of the analog input signal VIN (block 312). As discussed above, in this example, the TTB circuit 118 in FIG. 1 is configured to receive the digital signals 116(1)(1)-116(B)(C) from the comparator circuits 114(1)(1)-114(B)(C) of each parallel comparator stage 108(1)-108(B). The TTB circuit 118 is further configured to generate the digital bits DG(1)-DG(A) corresponding to each parallel comparator stage 108(1)-108 (B) to generate the digital output signal DOUT.

Figure 4:
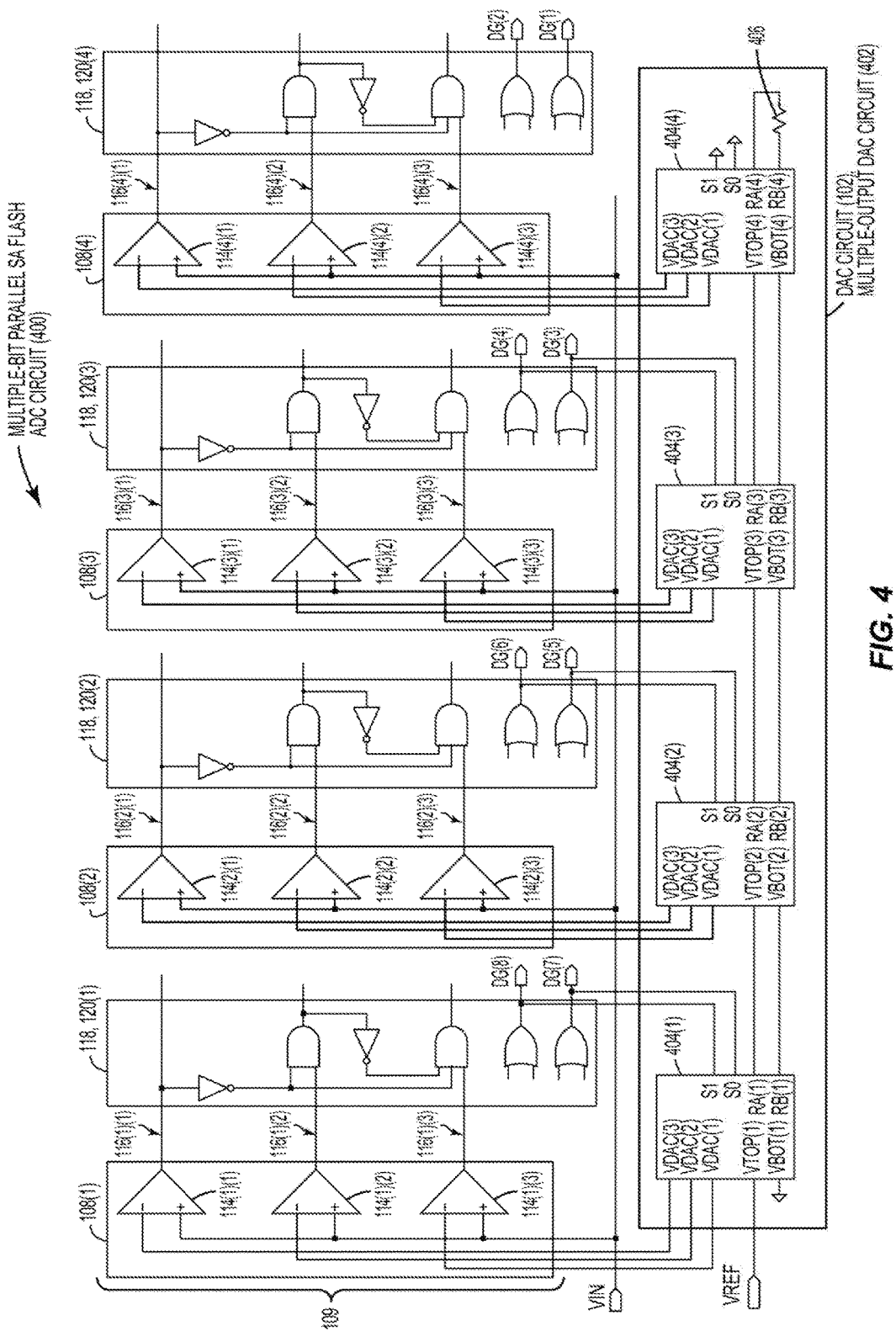
FIG. 4 is a circuit diagram of an exemplary multiple-bit parallel SA Flash ADC circuit that employs a multiple-output DAC circuit instead of single-output DAC circuits for each corresponding comparator circuit.

As noted above, the DAC circuit 102 in the multiple-bit parallel SA Flash ADC circuit 100 of FIG. 1 can employ one multiple-output DAC circuit instead of the DAC arrays 110(1)-110(B) to reduce overall area consumption. In this regard, FIG. 4 illustrates an exemplary multiple-bit parallel SA Flash ADC circuit 400 that employs a multiple-output DAC circuit 402 for the DAC circuit 102 instead of single-output DAC circuits 112(1)(1)-112(B)(C) for each corresponding comparator circuit 114(1)(1)-111.4(B)(C) as in the multiple-bit parallel SA Flash ADC circuit 100 of FIG. 1. The multiple-bit parallel SA Flash ADC circuit 400 in this aspect is a two (2) bit parallel eight (8) bit SA Flash ADC circuit 400, wherein the multiple-output DAC circuit 402 employs a DAC stage 404(1)-404(4) corresponding to each parallel comparator stage 108(1)-108(4). Other aspects employing the multiple-output DAC circuit 402 can include any number of DAC stages 404(1)-404(B), wherein each DAC stage 404(1)-404(B) corresponds to a parallel comparator stage 108(1)-108(B). The multiple-bit parallel SA Flash ADC circuit 400 includes common elements with the multiple-bit parallel SA Flash ADC circuit 100 of FIG. 1, which are referred to with common element numbers in FIG. 1 and FIG. 4, and thus will not re-described herein.

With continuing reference to FIG. 4, each DAC stage 404(1)-404(4) is configured to generate corresponding DAC voltages VDAC(1)-VDAC(3), wherein each DAC voltage VDAC(1)-VDAC(3) of each DAC stage 404(1)-404(4) is provided to a corresponding comparator circuit 114(1)(1)-114(4)(3) in each corresponding parallel comparator stage 108(1)-108(4). In particular, each DAC stage 404(1)-404(4) is configured to receive a corresponding top voltage VTOP(1)-VTOP(4) and a corresponding bottom voltage VBOT(1)-VBOT(4). Each DAC stage 404(1)-404(4) is further configured to generate each DAC voltage VDAC(1)-VDAC(3) by dividing a voltage range of each corresponding top voltage VTOP(1)-VTOP(4) and each bottom voltage VBOT(1)-VBOT(4). For example, the reference voltage VREF is provided to the DAC stage 404(1) as the top voltage VTOP(1), while a ground signal is provided to the DAC stage 404(1) as the bottom voltage VBOT(1). Thus, the DAC voltages VDAC(1)-VDAC(3) of the DAC stage 404(1) are divisions of the range between the reference voltage VREF and the ground signal. In this manner, the parallel comparator stage 108(1) generates the digital signals 116(1)(1)-116(1)(3) based on each division of the voltage reference VREF such that the digital bits DG(8), DG(7) are generated based on whether the analog input voltage VIN is greater than or less than each corresponding DAC voltage VDAC(1)-VDAC(3). In this manner, the DAC voltages VDAC(1)-VDAC(3) eliminate the need for the trial bit codes 104(1)(1)-104(1)(3) discussed with reference to FIG. 1. Further, although each DAC stage 404(1)-404(4) in this aspect is configured to generate a set of DAC voltages VDAC(1)-VDAC(3), other aspects may be configured to generate any number N of DAC voltages VDAC(1)-VDAC(N).

With continuing reference to FIG. 4, the digital bits DG(8)-DG(3) are used to determine the top voltage VTOP(2)-VTOP(4) and the bottom voltage VBOT(2)-VBOT(4) for the subsequent DAC stages 404(2)-404(4). For example, in response to the digital bits DG(8), DG(7) reaching a stable state, the DAC stage 404(1) provides the top voltage VTOP(2) and the bottom voltage VBOT(2) for the DAC stage 404(2) from output nodes RA(1), RB(1). Additionally, the digital bits DG(6)-DG(5) are used by the DAC stage 404(2) to determine the top and bottom voltages VTOP(3), VBOT(3) to provide to the DAC stage 404(3) from output nodes RA(2), RB(2). Further, the digital bits DG(4), DG(3) are used by the DAC stage 404(3) to determine the top and bottom voltages VTOP(4), VBOT(4) to provide to the DAC stage 404(4) from output nodes RA(3), RB(3). Using the digital bits DG(8), DG(7) in this manner results in the top and bottom voltages VTOP(2), VBOT(2) having a voltage range in which the analog input voltage VIN falls within. Thus, the top voltages VTOP(1)-VTOP(4) and the bottom voltages VBOT(1)-VBOT(4) are generated such that the multiple-bit parallel SA Flash ADC circuit 400 is able to use successive approximation when generating the digital bits DG(8)-DG(1). Additionally, the digital bits DG(6)-DG(5) are used by the DAC stage 404(2) to determine the top and bottom voltages VTOP(3), VBOT(3) to provide to the DAC stage 404(3) from output nodes RA(2), RB(2). Further, the digital bits DG(4), DG(3) are used by the DAC stage 404(3) to determine the top and bottom voltages VTOP(4), VBOT (4) to provide to the DAC stage 404(4) from output nodes RA(3), RB(3). The digital bits DG(2), DG(1) are not provided to the DAC stage 404(4) because the DAC stage 404(4) (i.e., the final DAC stage 404(4) of the multiple-output DAC circuit 402) does not provide voltages to a subsequent DAC stage. Rather, in this aspect, a resistor 406 is electrically coupled to output nodes RA(4), RB(4) of the DAC stage 404(4).

With continuing reference to FIG. 4, it is worth noting that some aspects of the multiple-bit parallel SA Flash ADC circuit 400 may be designed such that the number of digital bits DG(1)-DG(A) of each corresponding parallel comparator stage 108(1)-108(B) is equal to one (1). Thus, the number C is equal to one (1) (e.g., C=(2^D)−1=(2^1)−1=1) such that each parallel comparator stage 108(1)-108(B) includes one (1) corresponding comparator circuit 114(1)(1)-114(3)(1). In such aspects, the system compare circuit 109 does not include the TTB circuit 118, as the digital signal 116(1)(1)-116(B)(1) of each corresponding comparator circuit 114(1)(1)-114(B)(1) serves as the corresponding digital bit DG(1)-DG(A).

Figure 5:
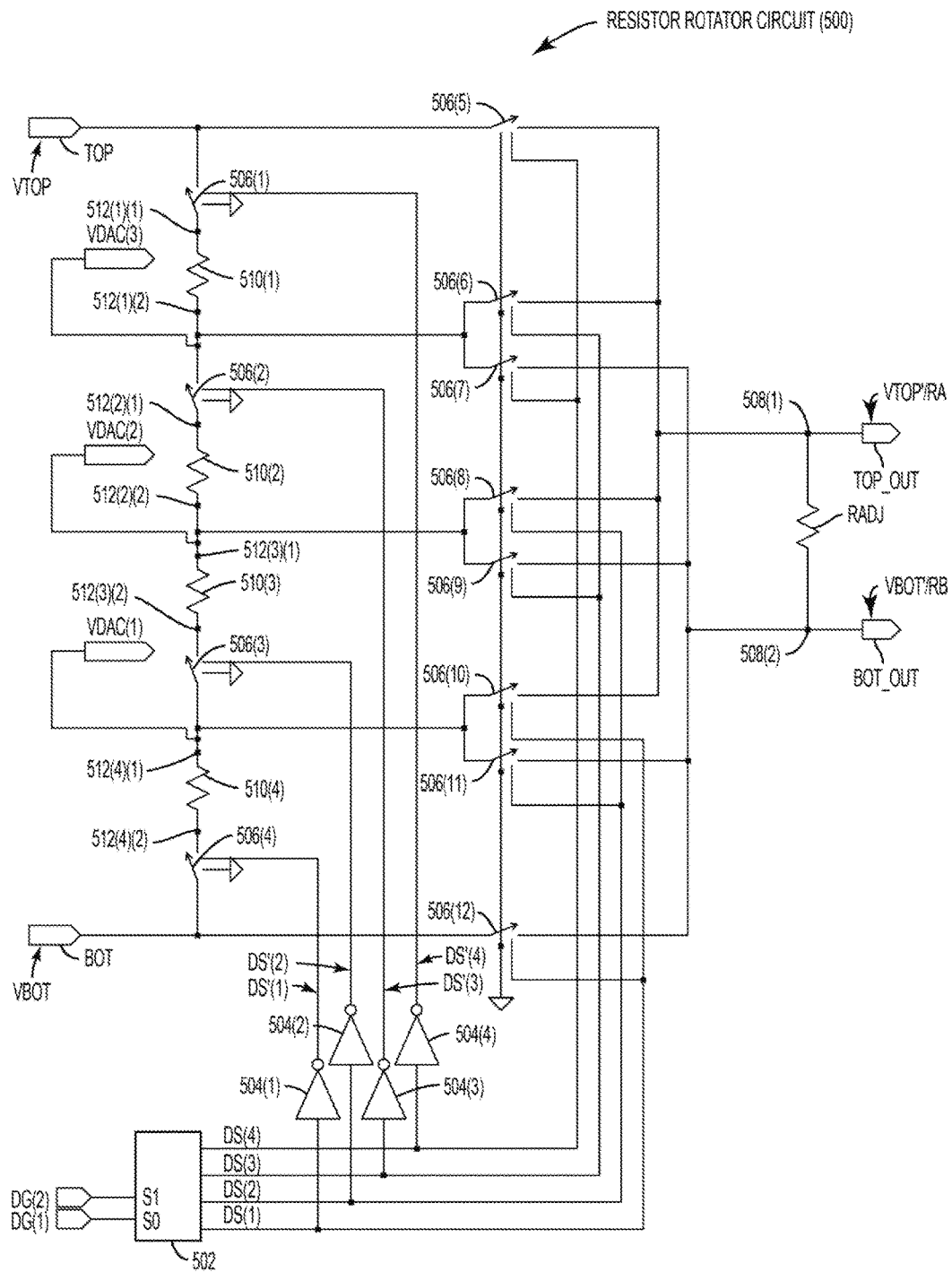
FIG. 5 is a circuit diagram of an exemplary resistor rotator circuit that can be employed for each DAC stage of the multiple-output DAC circuit of FIG. 4.

Employing the multiple-output DAC circuit 402 as described above reduces the area consumption of the DAC circuit 102 compared to employing the DAC arrays 110(1)-110(B) described in FIG. 1, because each DAC stage 404(1)-404(4) can be implemented with less circuitry than each DAC array 110(1)-110(B) in FIG. 1. In this regard, FIG. 5 illustrates an exemplary resistor rotator circuit 500 that can be employed in each DAC stage 404(1)-404(4) of FIG. 4. The resistor rotator circuit 500 is configured to receive a top voltage VTOP on a top voltage input node TOP, and a bottom voltage VBOT on a bottom voltage input node BOT. The resistor rotator circuit 500 also includes a decoder circuit 502 configured to receive the digital bits DG(2), DG(1) of the corresponding parallel comparator stage 108, and generate decode signals DS(1)-DS(4) based on the digital bits DG(2), DG(1). In this aspect, the decoder circuit 502 is a one-hot decoder, wherein only one of the decode signals DS(1)-DS(4) has a logic high "1" value for any given value of the digital bits DG(2), DG(1). For example, the decode signals DS(1)-DS(4) are generated according to the following logic functions: DS(1)=(inverse DG(2) AND inverse DG(1)); DS(2)=(inverse DG(2) AND DG(1)); DS(3)=(DG(2) AND inverse DG(1)); and DS(4)=DG(2) AND DG(1)). The resistor rotator circuit 500 also includes inverters 504(1)-504(4) configured to receive a corresponding decode signal DS(1)-DS(4), and generate corresponding inverse decode signals DS'(1)-DS'(4).

With continuing reference to FIG. 5, the resistor rotator circuit 500 also includes switches 506(1)-506(12), wherein a logic high "1" value closes a switch 506(1)-506(12), and a logic low "0" value opens a switch 506(1)-506(12). The switches 506(1)-506(4) are configured to receive a corresponding inverse decode signal DS'(1)-DS'(4). Additionally, the switches 506(5), 506(7) are configured to receive the decode signal DS(4), the switches 506(6), 506(9) are configured to receive the decode signal DS(3),), the switches 506(8), 506(11) are configured to receive the decode signal DS(2), and the switches 506(10), 506(12) are configured to receive the decodes signal D(1). A resistor RADJ is also included, wherein a first node 508(1) is electrically coupled to a top voltage output node RA, and a second node 508(2) is electrically coupled to a bottom voltage output node RB. A resistance of the resistor RADJ may be adjusted such that the parallel combination of the resistor RADJ and a desired resistance R_NEXT of a next DAC stage 404 is maintained at a desired constant value so that the resistor rotator circuit 500 generates the desired output. The resistance R_NEXT is equal to the sum total of resistors 510(1)-510(4) and assuming that resistances of the switches 506(1)-506(4) are negligible in comparison in this example. Additionally, the resistor rotator circuit 500 includes the resistors 510(1)-510(4) serially coupled alternatingly with the corresponding switches 506(1)-506(4), and coupled in parallel with switches 506(5)-506(12). The resistance of resistor RADJ may be equal to the resistance of the resistors 510(1)-510(4). In particular, a first node 512(1)(1) of the resistor 510(1) is electrically coupled to the switch 506(1), and a second node 512(1)(2) is electrically coupled to the switches 506(2), 506(6), and 506(7). A first node 512(2)(1) of the resistor 510(2) is electrically coupled to the switch 506(2), and a second node 512(2)(2) is electrically coupled to a first node 512(3)(1) of the resistor 510(3) and the switches 506(8), 506(9). The first node 512(3)(1) of the resistor 510(3) is electrically coupled to the switches 506(8), 506(9), and a second node 512(3)(2) is electrically coupled to the switch 506(3). A first node 512(4)(1) of the resistor 510(4) is electrically coupled to the switches 506(3), 506(10), and 506(11), and a second node 512(4)(2) is electrically coupled to the switch 506(4). Note that the switches 506(1)-506(12) could also be implemented using transistors of "low enough" on-resistance.

With continuing reference to FIG. 5, the configuration above results in the resistor rotator circuit 500 generating the DAC voltages VDAC(1)-VDAC(3), each of which is within the voltage range between the top voltage VTOP and the bottom voltage VBOT. In this aspect, the resistors 510(1)-510(4) each have an approximately equal resistance (e.g., 2 kilo-Ohms (kΩ)) such that the DAC voltages VDAC(1)-VDAC(3) are equal divisions of the voltage range between the top voltage VTOP and the bottom voltage VBOT. Additionally, if employing the resistor rotator circuit 500 for each DAC stage 404(1)-404(4) in FIG. 4, the resistor 406 has a resistance of eight (8) kilo-Ohms (kΩ), and the resistor RAW between the first node 508(1) and the second node 508(2) would have a value of 2.667 kΩ. For example, if the reference voltage VREF is equal to one (1.0) Volt (V), then the DAC voltages VDAC(3)-VDAC(1) may equal 0.75 V, 0.5 V, and 0.25 V, respectively, regardless of the values of the digital bits DG(2), DG(1). Additionally, the configuration above results in the resistor rotator circuit 500 generating a next stage top voltage VTOP' on the top voltage output node TOP_OUT, and a next stage bottom voltage VBOT' on the bottom voltage output node BUT_OUT, wherein the next stage top and bottom voltages VTOP', VBOT' are determined according to which of the switches 506(1)-506(12) are open or closed based on the digital bits DG(2), DG(1). Further, although the resistor rotator circuit 500 in this aspect is configured to generate the DAC voltages VDAC(1)-VDAC(3), other aspects may be configured to generate any number N of DAC voltages VDAC(1)-VDAC(N).

Figure 6:
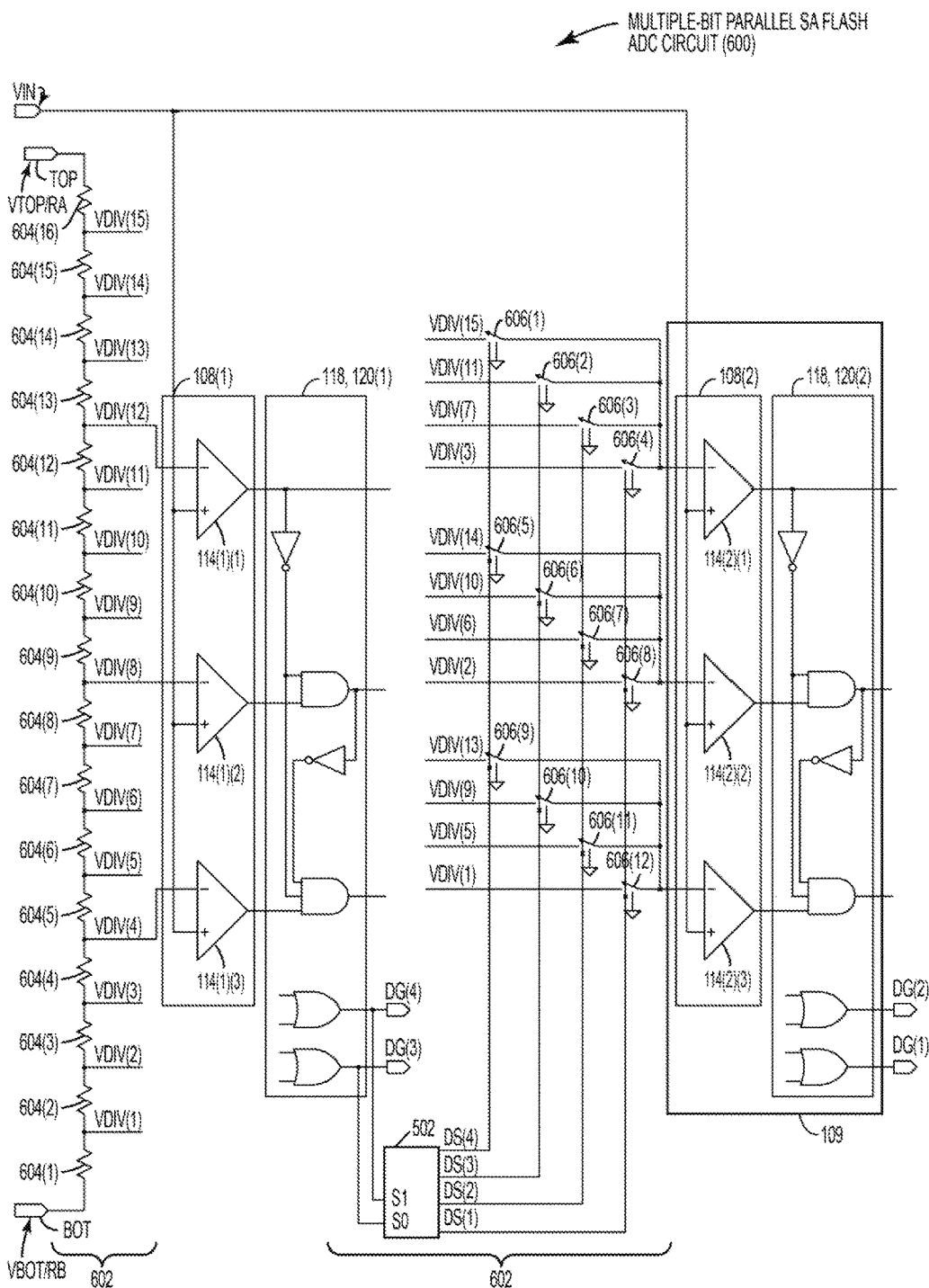
FIG. 6 is a circuit diagram of another exemplary multiple-bit parallel SA Flash ADC circuit that employs another multiple-output DAC circuit instead of single-output DAC circuits for each corresponding comparator circuit.

FIG. 6 illustrates another exemplary multiple-bit parallel SA Flash ADC circuit 600 that employs another topology of multiple-output DAC circuit 602 instead of single-output DAC circuits 112(1)(1)-112(B)(C) for each corresponding comparator circuit 114(1)(1)-114(B)(C) as in the multiple-bit parallel SA Flash ADC circuit 100 of FIG. 1. The multiple-bit parallel SA Flash ADC circuit 600 in this aspect is a two (2) bit parallel four (4) bit SA Flash ADC circuit 600. The multiple-bit parallel SA Flash ADC circuit 600 includes common elements with the multiple-bit parallel SA Flash ADC circuit 400 of FIG. 4 and the resistor rotator circuit 500 in FIG. 5, which are referred to with common element numbers in FIGS. 4, 5, and 6, and thus will not re-described herein.

With continuing reference to FIG. 6, the multiple-output DAC circuit 602 includes serially connected resistors 604(1)-604(16), wherein the resistor 604(16) (i.e., the top resistor 604(16)) is electrically coupled to a top voltage input node TOP configured to receive a top voltage VTOP, and the resistor 604(1) (i.e., the bottom resistor 604(1)) is electrically coupled to a bottom voltage input node BUT configured to receive a bottom voltage VBOT. In this aspect, each of the resistors 604(1)-604(16) has approximately the same resistance (e.g., 2Ω) such that a divided voltage VDIV(1)-VDIV(15) corresponding to each pair of the resistors 604(1)-604(16) are approximately equal divisions of the voltage range VTOP-VBOT. For example, if the top voltage VTOP is approximately equal to 1.0 V and the bottom voltage VBOT is approximately equal to 0 V, then the resistors 604(1)-604(16) are configured to generate the divided voltages VDIV(1)-VDIV(15) in increments differing by 0.0625 V (e.g., 1⁄16 V). Thus, the divided voltage VDIV(1) corresponding to the resistors 604(1), 604(2) is approximately equal to 0.0625 V, the divided voltage VDIV(2) corresponding to the resistors 604(2), 604(3) is approximately equal to 0.125 V, and the divided voltage VDIV(15) corresponding to the resistors 604(15), 604(16) is approximately equal to 0.9375 V. Further, the divided voltage VDIV(12) is provided to the comparator circuit 114(1)(1) in the parallel comparator stage 108(1), the divided voltage VDIV(8) is provided to the comparator circuit 114(1)(2) in the parallel comparator stage 108(1), and the divided voltage VDIV(4) is provided to the comparator circuit 114(1)(3) in the parallel comparator stage 108(1).

With continuing reference to FIG. 6, the multiple-output DAC circuit 602 also includes switches 606(1)-606(12) electrically coupled to the parallel comparator stage 108(2). The decoder circuit 502 is configured to receive the digital bits DG(4), DG(3) of the corresponding parallel comparator stage 108(1), and generate decode signals DS(4)-DS(1). The switches 606(1), 606(5), and 606(9) are configured to receive the decode signal DS(4), and the switches 606(2), 606(6), and 606(10) are configured to receive the decode signal DS(3). Additionally, the switches 606(3), 606(7), and 606(11) are configured to receive the decode signal DS(2), and the switches 606(4), 606(8), and 606(12) are configured to receive the decode signal DS(2). The divided voltages VDIV(15), VDIV(11), VDIV(7), and VDIV(3) are provided to the switches 606(1)-606(4), respectively, wherein the switches 606(1)-606(4) are electrically coupled to the comparator circuit 114(2)(1) in the parallel comparator stage 108(2). The divided voltages VDIV(14), VDIV(10), VDIV(6), and VDIV(2) are provided to the switches 606(5)-606(8), respectively, wherein the switches 606(5)-606(8) are electrically coupled to the comparator circuit 114(2)(2) in the parallel comparator stage 108(2). Further, the divided voltages VDIV(B), VDIV(9), VDIV(5), and VDIV(1) are provided to the switches 606(9)-606(12), respectively, wherein the switches 606(9)-606(12) are electrically coupled to the comparator circuit 114(2)(3) in the parallel comparator stage 108(2). Employing the multiple-output DAC circuit 602 as described above reduces the area consumption of the DAC circuit 102 compared to employing the DAC arrays 110(1)(1)-110(B)(C) described in FIG. 1, because the multiple-output DAC circuit 602 can be implemented with less circuitry than each DAC array 110(1)(1)-110(B)(C) in FIG. 1.

The elements described herein are sometimes referred to as means for performing particular functions. In this regard, the DAC circuit 102 is sometimes referred to herein as "a means for converting a digital value into an analog value configured to receive a reference voltage and generate a plurality of DAC analog signals, wherein each DAC analog signal is based on the reference voltage." The parallel comparator stages 108(1)-108(B) are sometimes referred to herein as "a plurality of means for comparing values in parallel." The comparator circuits 114(1)(1)-114(B)(C) are sometimes referred to herein as the "means for comparing values," wherein "each means for comparing values in parallel comprises a number of means for comparing, wherein the number of means for comparing of each means for comparing values in parallel is equal to two (2) raised to a number of digital bits of the corresponding means for comparing values in parallel, quantity minus one (1)." Further, "each number of means for comparing is configured to receive an analog input signal receive a corresponding DAC analog signal and generate a digital signal," wherein "the digital signal has a logic high value if the analog input signal has a greater voltage than the corresponding DAC analog signal and the digital signal has a logic low value if the analog input signal has a smaller voltage than the corresponding DAC analog signal." The TTB circuit 118 is sometimes referred to herein as "a means for binary conversion, configured to receive the digital signals from the number of means for comparing of each means for comparing values in parallel of the plurality of means for comparing values in parallel and generate one or more digital bits corresponding to each means for comparing values in parallel, wherein the one or more digital bits collectively generate a digital output signal that is a digital representation of the analog input signal." The multiple-output DAC circuit 402 is sometimes referred to herein as "a multiple-output means for converting a digital value into an analog value." The resistor rotator circuit 500 is sometimes referred to herein as "a means for dividing a voltage configured to generate the corresponding number of DAC analog signals by generating divisions of the voltage range."

The multiple-bit parallel SA Flash ADC circuits according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 7:
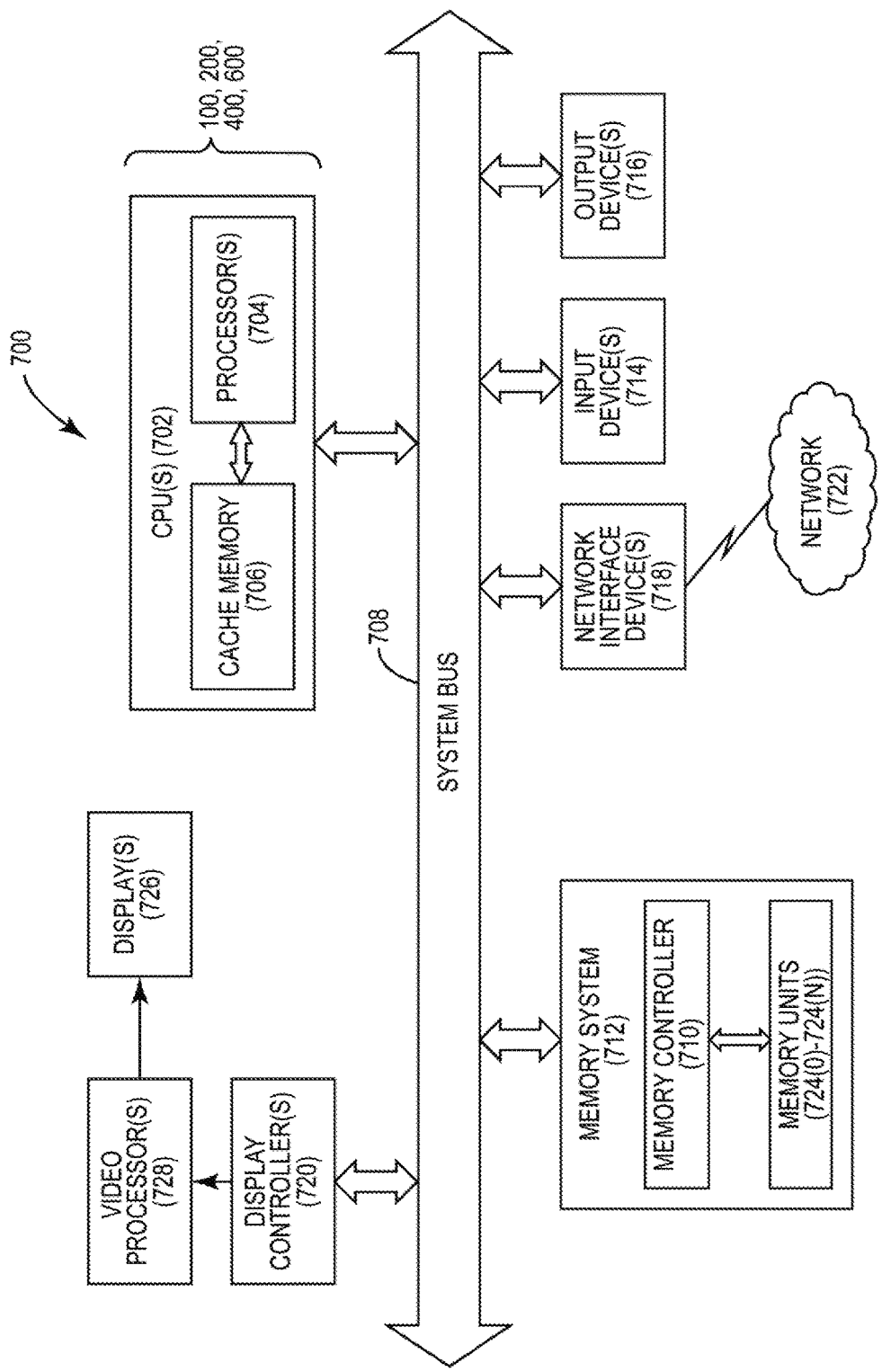
FIG. 7 is a block diagram of an exemplary processor-based system that can include the multiple-bit parallel SA Flash ADC circuits of FIGS. 1, 2, 4, and 6.

In this regard, FIG. 7 illustrates an example of a processor-based system 700 that can include elements employing the multiple-bit parallel SA Flash ADC circuits 100, 200, 400, and 600 of FIGS. 1, 2, 4, and 6, respectively. In this example, the processor-based system 700 includes one or more central processing units (CPUs) 702, each including one or more processors 704. The CPU(s) 702 may have cache memory 706 coupled to the processor(s) 704 for rapid access to temporarily stored data. The CPU(s) 702 is coupled to a system bus 708 and can intercouple master and slave devices included in the processor-based system 700. As is well known, the CPU(s) 702 communicates with these other devices by exchanging address, control, and data information over the system bus 708. For example, the CPU(s) 702 can communicate bus transaction requests to a memory controller 710 as an example of a slave device. Although not illustrated in FIG. 7, multiple system buses 708 could be provided, wherein each system bus 708 constitutes a different fabric.

Other master and slave devices can be connected to the system bus 708. As illustrated in FIG. 7, these devices can include a memory system 712, one or more input devices 714, one or more output devices 716, one or more network interface devices 718, and one or more display controllers 720, as examples. The input device(s) 714 can include any type of input device, including, but not limited to, input keys, switches, voice processors, etc. The output device(s) 716 can include any type of output device, including, but not limited to, audio, video, other visual indicators, etc. The network interface device(s) 718 can be any device configured to allow exchange of data to and from a network 722. The network 722 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 718 can be configured to support any type of communications protocol desired. The memory system 712 can include one or more memory units 724(0)-724(N).

The CPU(s) 702 may also be configured to access the display controller(s) 720 over the system bus 708 to control information sent to one or more displays 726. The display controller(s) 720 sends information to the display(s) 726 to be displayed via one or more video processors 728, which process the information to be displayed into a format suitable for the display(s) 726. The display(s) 726 can include any type of display, including, but not limited to, a cathode ray tube (CRT), a liquid crystal display (LCD), a plasma display, a light emitting diode (LED) display, etc.

Figure 8:
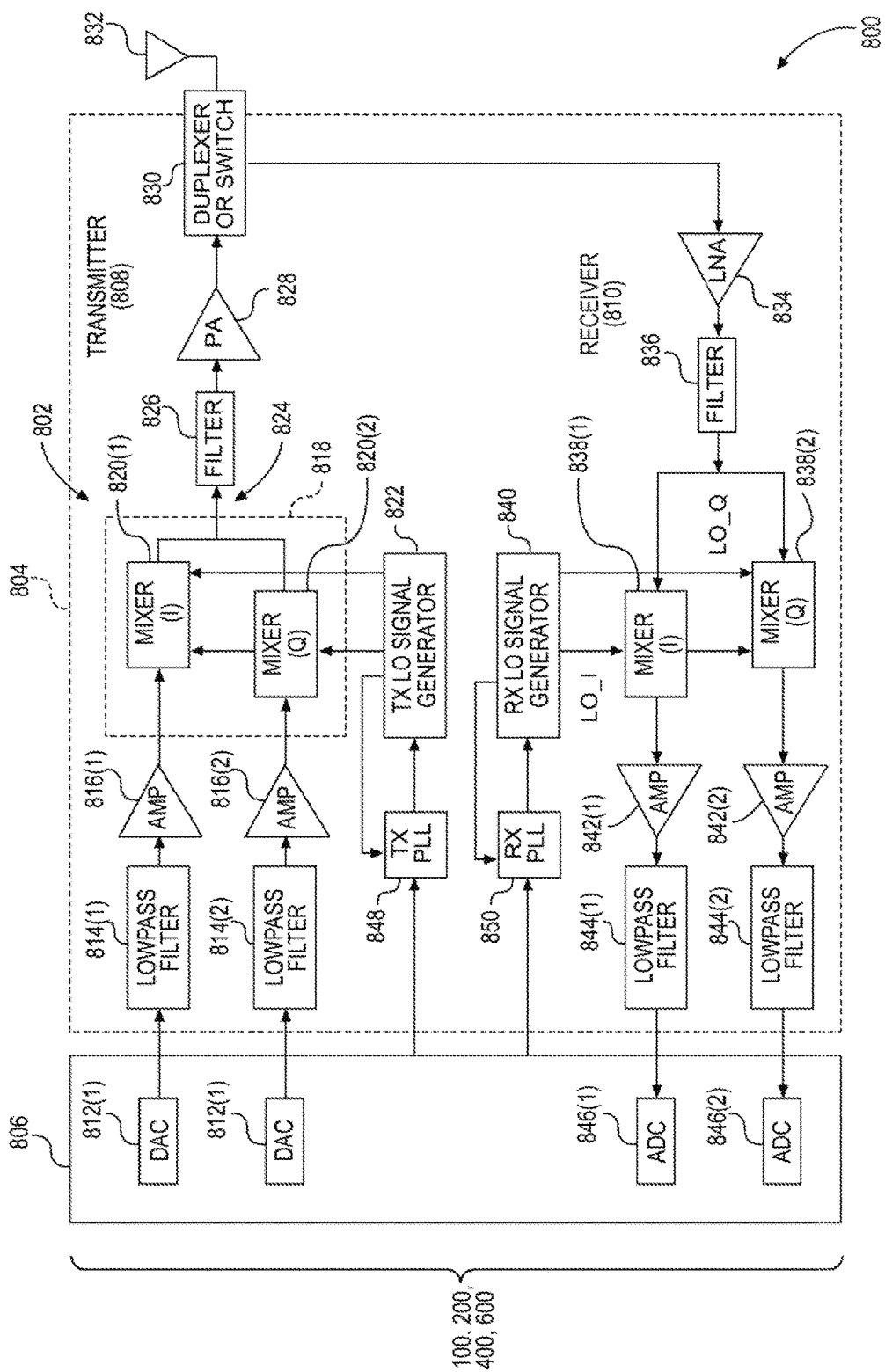
FIG. 8 is a block diagram of an exemplary wireless communications device that includes radio frequency (RF) components formed in an integrated circuit (IC), wherein the RF components can include elements employing the multiple-bit parallel SA Flash ADC circuits of FIGS. 1, 2, 4, and 6.

FIG. 8 illustrates an exemplary wireless communications device 800 that includes radio frequency (RF) components formed in an integrated circuit (IC) 802, wherein the RF components can include elements employing the multiple-bit parallel SA Flash ADC circuits 100, 200, 400, and 600 of FIGS. 1, 2, 4, and 6, respectively. In this regard, the wireless communications device 800 may be provided in the IC 802. The wireless communications device 800 may include or be provided in any of the above referenced devices, as examples. As shown in FIG. 8, the wireless communications device 800 includes a transceiver 804 and a data processor 806. The data processor 806 may include a memory to store data and program codes. The transceiver 804 includes a transmitter 808 and a receiver 810 that support bi-directional communications. In general, the wireless communications device 800 may include any number of transmitters 808 and/or receivers 810 for any number of communication systems and frequency bands. All or a portion of the transceiver 804 may be implemented on one or more analog ICs, RF ICs (RF ICs), mixed-signal ICs, etc.

The transmitter 808 or the receiver 810 may be implemented with a super-heterodyne architecture or a direct-conversion architecture. In the super-heterodyne architecture, a signal is frequency-converted between RF and baseband in multiple stages, e.g., from RE to an intermediate frequency (IF) in one stage, and then from IF to baseband in another stage for the receiver 810. In the direct-conversion architecture, a signal is frequency-converted between RF and baseband in one stage. The super-heterodyne and direct-conversion architectures may use different circuit blocks and/or have different requirements. In the wireless communications device 800 in FIG. 8, the transmitter 808 and the receiver 810 are implemented with the direct-conversion architecture.

In the transmit path, the data processor 806 processes data to be transmitted and provides I and Q analog output signals to the transmitter 808. In the exemplary wireless communications device 800, the data processor 806 includes DACs 812(1), 812(2) for converting digital signals generated by the data processor 806 into the I and Q analog output signals, e.g., I and Q output currents, for further processing.

Within the transmitter 808, lowpass filters 814(1), 814(2) filter the I and Q analog output signals, respectively, to remove undesired signals caused by the prior digital-to-analog conversion. Amplifiers (AMP) 816(1), 816(2) amplify the signals from the lowpass filters 814(1), 814(2), respectively, and provide I and Q baseband signals. An upconverter 818 upconverts the I and Q baseband signals with I and Q transmit (TX) local oscillator (LO) signals through mixers 820(1), 820(2) from a TX LO signal generator 822 to provide an upconverted signal 824. A filter 826 filters the upconverted signal 824 to remove undesired signals caused by the frequency upconversion as well as noise in a receive frequency band. A power amplifier (PA) 828 amplifies the upconverted signal 824 from the filter 826 to obtain the desired output power level and provides a transmit RF signal. The transmit RF signal is routed through a duplexer or switch 830 and transmitted via an antenna 832.

In the receive path, the antenna 832 receives signals transmitted by base stations and provides a received RF signal, which is routed through the duplexer or switch 830 and provided to a low noise amplifier (LNA) 834. The duplexer or switch 830 is designed to operate with a specific receive (RX)-to-TX duplexer frequency separation, such that RX signals are isolated from TX signals. The received RF signal is amplified by the LNA 834 and filtered by a filter 836 to obtain a desired RF input signal. Downconversion mixers 838(1), 838(2) mix the output of the filter 836 with I and Q RX LO signals (i.e., LO_I and LO_Q) from an RX LO signal generator 840 to generate I and Q baseband signals. The I and Q baseband signals are amplified by amplifiers (AMP) 842(1), 842(2) and further filtered by lowpass filters 844(1), 844(2) to obtain I and Q analog input signals, which are provided to the data processor 806. In this example, the data processor 806 includes ADCs 846(1), 846(2) for converting the analog input signals into digital signals to be further processed by the data processor 806.

In the wireless communications device 800 of FIG. 8, the TX LO signal generator 822 generates the I and Q TX LO signals used for frequency upconversion, while the RX LO signal generator 840 generates the I and Q RX LO signals used for frequency downconversion. Each LO signal is a periodic signal with a particular fundamental frequency. A TX phase-locked loop (PLL) circuit 848 receives timing information from the data processor 806 and generates a control signal used to adjust the frequency and/or phase of the TX LO signals from the TX LO signal generator 822. Similarly, an RX PLL circuit 850 receives timing information from the data processor 806 and generates a control signal used to adjust the frequency and/or phase of the RX LO signals from the RX LO signal generator 840.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A multiple-bit parallel successive approximation (SA) Flash analog-to-digital converter (ADC) circuit, comprising:
   a digital-to-analog converter (DAC) circuit configured to:
   receive a reference voltage; and
   generate a plurality of DAC analog signals, wherein each DAC analog signal is based on the reference voltage; and
   a system compare circuit, comprising a plurality of parallel comparator stages, wherein each parallel comparator stage of the plurality of parallel comparator stages comprises:
   one or more comparator circuits, wherein:
      the one or more comparator circuits of each parallel comparator stage is equal to two (2) raised to a number of digital bits of the corresponding parallel comparator stage, quantity minus one (1); and
      each comparator circuit of the one or more comparator circuits is configured to:
         receive an analog input signal;
         receive a corresponding DAC analog signal; and
         generate a digital signal, wherein:
            the digital signal has a logic high value if the analog input signal has a greater voltage than the corresponding DAC analog signal; and
            the digital signal has a logic low value if the analog input signal has a smaller voltage than the corresponding DAC analog signal;
   wherein:
      the system compare circuit configured to generate one or more digital bits corresponding to each parallel comparator stage based on each corresponding digital signal, wherein the one or more digital bits collectively generate a digital output signal that is a digital representation of the analog input signal; and
      the DAC circuit comprises a plurality of DAC arrays, each DAC array of the plurality of DAC arrays corresponding to a parallel comparator stage of the plurality of parallel comparator stages and comprising a number of single-output DAC circuits, wherein:
         the number of single-output DAC circuits of each DAC array is equal to a number of the one or more comparator circuits of the corresponding parallel comparator stage;
         each single-output DAC circuit in the DAC array corresponding to most significant bits of the digital output signal is configured to:
            receive a corresponding trial bit code comprising a digital bit sequence with defined values for one or more digital bits corresponding to the digital output signal; and
            generate the corresponding DAC analog signals, wherein each corresponding DAC analog signal is based on the reference voltage and the corresponding trial bit code; and
         each single-output DAC circuit of the plurality of DAC arrays other than the DAC array corresponding to the most significant bits is configured to:
            receive a corresponding trial bit code and one or more digital bits of each parallel comparator stage; and
            generate the plurality of DAC analog signals, wherein each DAC analog signal is based on the reference voltage, the corresponding trial bit code, and the corresponding one or more digital bits.

2. The multiple-bit parallel SA Flash ADC circuit of claim 1, wherein the system compare circuit further comprises a thermometer-to-binary (TTB) circuit, configured to:
   receive the digital signals from the one or more comparator circuits of each parallel comparator stage of the plurality of parallel comparator stages; and
   generate the one or more digital bits corresponding to each parallel comparator stage, wherein the one or more digital bits collectively generate the digital output signal that is the digital representation of the analog input signal.

3. The multiple-bit parallel SA Flash ADC circuit of claim 1, comprising four (4) parallel comparator stages, wherein each parallel comparator stage comprises three (3) comparator circuits such that the multiple-bit parallel SA Flash ADC circuit is configured to generate a twelve (12) bit digital output signal.

4. The multiple-bit parallel SA Flash ADC circuit of claim 1, comprising two (2) parallel comparator stages, wherein each parallel comparator stage comprises three (3) comparator circuits such that the multiple-bit parallel SA Flash ADC circuit is configured to generate a six (6) bit digital output signal.

5. The multiple-bit parallel SA Flash ADC circuit of claim 1 integrated into an integrated circuit (IC).

6. The multiple-bit parallel SA Flash ADC circuit of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

7. A multiple-bit parallel successive approximation (SA) Flash analog-to-digital converter (ADC) circuit, comprising:
   a means for converting a digital value into an analog value, configured to:

receive a reference voltage;
generate a plurality of digital-to-analog converter (DAC) analog signals, wherein each DAC analog signal is based on the reference voltage; and
a means for generating digital bits, comprising a plurality of means for comparing values in parallel, wherein each means for comparing values in parallel comprises:
a number of means for comparing, wherein:
the number of means for comparing each means for comparing values in parallel is equal to two (2) raised to a number of digital bits of the corresponding means for comparing values in parallel, quantity minus one (1); and
each means for comparing is configured to:
receive an analog input signal;
receive a corresponding DAC analog signal; and
generate a digital signal, wherein:
the digital signal has a logic high value if the analog input signal has a greater voltage than the corresponding DAC analog signal; and
the digital signal has a logic low value if the analog input signal has a smaller voltage than the corresponding DAC analog signal;
wherein:
the means for generating digital bits configured to generate one or more digital bits corresponding to each means for comparing values in parallel, wherein the one or more digital bits collectively generate a digital output signal that is a digital representation of the analog input signal; and
the means for converting the digital value into the analog value comprises a plurality of DAC arrays, each DAC array of the plurality of DAC arrays corresponds to the means for comparing values in parallel and comprises a number of single-output means for converting a digital value into an analog value, wherein:
the number of single-output means for converting the digital value into the analog value of each DAC array is equal to the number of means for comparing of the corresponding means for comparing values in parallel;
each single-output means for converting the digital value into the analog value in the DAC array corresponding to most significant bits of the digital output signal is configured to:
receive a trial bit code comprising a digital bit sequence with defined values for the one or more digital bits corresponding to the digital output signal; and
generate the corresponding plurality of DAC analog signals, wherein each corresponding DAC analog signal is based on the reference voltage and the corresponding trial bit code; and
each single-output means for converting the digital value into the analog value of the plurality of DAC arrays other than the DAC array corresponding to the most significant bits is configured to:
receive a corresponding trial bit code and one or more digital bits of the one or more digital bits generated by the means for comparing values in parallel; and
generate the plurality of DAC analog signals, wherein each DAC analog signal is based on the reference voltage, the corresponding trial bit code, and the corresponding one or more digital bits.

8. The multiple-bit parallel SA Flash ADC circuit of claim 7, wherein the means for generating digital bits further comprises a means for binary conversion, configured to:
receive digital signals from one or more comparator circuits of each parallel comparator stage of a plurality of parallel comparator stages; and
generate one or more digital bits corresponding to each parallel comparator stage, wherein the one or more digital bits collectively generate the digital output signal that is the digital representation of the analog input signal.

9. A method for converting an analog input signal into a digital output signal, wherein multiple digital bits of the digital output signal are determined in parallel, comprising:
receiving a reference voltage;
generating a plurality of digital-to-analog converter (DAC) analog signals, wherein each DAC analog signal is based on the reference voltage;
receiving the analog input signal;
generating one or more digital signals in a plurality of parallel comparator stages, wherein:
each digital signal is generated by comparing the analog input signal to a corresponding DAC analog signal;
each digital signal has a logic high value if the analog input signal has a greater voltage than the corresponding DAC analog signal; and
each digital signal has a logic low value if the analog input signal has a smaller voltage than the corresponding DAC analog signal;
generating one or more digital bits corresponding to each parallel comparator stage based on one or more digital signals of a corresponding parallel comparator stage, wherein the one or more digital bits collectively generate a digital output signal that is a digital representation of the analog input signal;
receiving a trial bit code comprising a digital bit sequence with defined values for the one or more digital bits corresponding to the digital output signal;
generating a number of DAC analog signals corresponding to most significant bits of the digital output signal, wherein each corresponding DAC analog signal is based on the reference voltage and the corresponding trial bit code; and
generating remaining DAC analog signals not corresponding to the most significant bits of the digital output signal, wherein each remaining DAC analog signal is based on the reference voltage, the corresponding trial bit code, and the corresponding one or more digital bits.

10. A multiple-bit parallel successive approximation (SA) Flash analog-to-digital converter (ADC) circuit, comprising:
a digital-to-analog converter (DAC) circuit configured to:
receive a reference voltage; and
generate a plurality of DAC analog signals, wherein each DAC analog signal is based on the reference voltage; and
a system compare circuit, comprising a plurality of parallel comparator stages, wherein each parallel comparator stage of the plurality of parallel comparator stages comprises:
one or more comparator circuits, wherein:
the one or more comparator circuits of each parallel comparator stage is equal to two (2) raised to a number of digital bits of the corresponding parallel comparator stage, quantity minus one (1); and each comparator circuit of the one or more comparator circuits is configured to:
receive an analog input signal;
receive a corresponding DAC analog signal; and
generate a digital signal, wherein:
the digital signal has a logic high value if the analog input signal has a greater voltage than the corresponding DAC analog signal; and
the digital signal has a logic low value if the analog input signal has a smaller voltage than the corresponding DAC analog signal;

wherein:
the system compare circuit configured to generate one or more digital bits corresponding to each parallel comparator stage based on each corresponding digital signal, wherein the one or more digital bits collectively generate a digital output signal that is a digital representation of the analog input signal; and
the DAC circuit comprises a multiple-output DAC circuit comprising a plurality of DAC stages, wherein:
each DAC stage of the plurality of DAC stages corresponds to a parallel comparator stage of the plurality of parallel comparator stages; and
each DAC stage of the plurality of DAC stages is configured to:
receive a corresponding top voltage and a corresponding bottom voltage, wherein a voltage range of the corresponding top voltage and the corresponding bottom voltage is based on the reference voltage; and
generate a number of DAC analog signals based on the corresponding top voltage and the corresponding bottom voltage, wherein the number of DAC analog signals is equal to a number of the one or more comparator circuits in each corresponding parallel comparator stage.

11. The multiple-bit parallel SA Flash ADC circuit of claim 10, wherein the system compare circuit further comprises a thermometer-to-binary (TTB) circuit, configured to:
receive the digital signals from the one or more comparator circuits of each parallel comparator stage of the plurality of parallel comparator stages; and
generate the one or more digital bits corresponding to each parallel comparator stage, wherein the one or more digital bits collectively generate the digital output signal that is the digital representation of the analog input signal.

12. The multiple-bit parallel SA Flash ADC circuit of claim 10, wherein the number of DAC analog signals generated by each DAC stage of the plurality of DAC stages has a value that is a division of the voltage range.

13. The multiple-bit parallel SA Flash ADC circuit of claim 10, wherein each DAC stage of the plurality of DAC stages comprises a resistor rotator circuit configured to generate a corresponding number of DAC analog signals by generating divisions of the voltage range.

14. The multiple-bit parallel SA Flash ADC circuit of claim 13, wherein the resistor rotator circuit of each DAC stage comprises:
a top voltage input node configured to receive the corresponding top voltage;
a bottom voltage input node configured to receive the corresponding bottom voltage;
a decoder circuit configured to:
receive the one or more digital bits of the corresponding parallel comparator stage; and
generate a number of decode signals based on the one or more digital bits, wherein the number of decode signals is equal to two (2) raised to a number of the one or more digital bits;
a plurality of inverters, wherein each inverter is configured to:
receive a corresponding decode signal; and
generate a corresponding inverse decode signal;
a plurality of switches, wherein:
a number of switches are configured to receive the corresponding inverse decode signal; and
a number of switches are configured to receive the corresponding decode signal; and
a plurality of resistors serially connected alternatingly with the number of switches configured to receive the corresponding inverse decode signal, wherein the plurality of resistors are arranged such that the plurality of resistors divide the voltage range into the number of DAC analog signals and into the top voltage and the bottom voltage to be provided to a next DAC stage.

15. A multiple-bit parallel successive approximation (SA) Flash analog-to-digital converter (ADC) circuit, comprising:
a digital-to-analog converter (DAC) circuit configured to:
receive a reference voltage; and
generate a plurality of DAC analog signals, wherein each DAC analog signal is based on the reference voltage; and
a system compare circuit, comprising a plurality of parallel comparator stages, wherein each parallel comparator stage of the plurality of parallel comparator stages comprises:
one or more comparator circuits, wherein:
the one or more comparator circuits of each parallel comparator stage is equal to two (2) raised to a number of digital bits of the corresponding parallel comparator stage, quantity minus one (1); and
each comparator circuit of the one or more comparator circuits is configured to:
receive an analog input signal;
receive a corresponding DAC analog signal; and
generate a digital signal, wherein:
the digital signal has a logic high value if the analog input signal has a greater voltage than the corresponding DAC analog signal; and
the digital signal has a logic low value if the analog input signal has a smaller voltage than the corresponding DAC analog signal;

wherein:
the system compare circuit configured to generate one or more digital bits corresponding to each parallel comparator stage based on each corresponding digital signal, wherein the one or more digital bits collectively generate a digital output signal that is a digital representation of the analog input signal;
wherein the plurality of parallel comparator stages comprises four (4) parallel comparator stages, and wherein each parallel comparator stage among the plurality of parallel comparator stages comprises three (3) comparator circuits such that the multiple-bit parallel SA Flash ADC circuit is configured to generate a twelve (12) bit digital output signal.

16. A multiple-bit parallel successive approximation (SA) Flash analog-to-digital converter (ADC) circuit, comprising:
a digital-to-analog converter (DAC) circuit configured to:
receive a reference voltage; and generate a plurality of DAC analog signals, wherein each DAC analog signal is based on the reference voltage; and a system compare circuit, comprising a plurality of parallel comparator stages, wherein each parallel comparator stage of the plurality of parallel comparator stages comprises:

one or more comparator circuits, wherein:

the one or more comparator circuits of each parallel comparator stage is equal to two (2) raised to a number of digital bits of the corresponding parallel comparator stage, quantity minus one (1); and each comparator circuit of the one or more comparator circuits is configured to:

receive an analog input signal;

receive a corresponding DAC analog signal; and generate a digital signal, wherein:

the digital signal has a logic high value if the analog input signal has a greater voltage than the corresponding DAC analog signal; and the digital signal has a logic low value if the analog input signal has a smaller voltage than the corresponding DAC analog signal;

wherein:

the system compare circuit configured to generate one or more digital bits corresponding to each parallel comparator stage based on each corresponding digital signal, wherein the one or more digital bits collectively generate a digital output signal that is a digital representation of the analog input signal;

wherein the plurality of parallel comparator stages comprises two (2) parallel comparator stages, wherein each parallel comparator stage among the plurality of parallel comparator stages comprises three (3) comparator circuits such that the multiple-bit parallel SA Flash ADC circuit is configured to generate a six (6) bit digital output signal.

17. A multiple-bit parallel successive approximation (SA) Flash analog-to-digital converter (ADC) circuit, comprising:

a means for converting a digital value into an analog value, configured to:

receive a reference voltage;

generate a plurality of digital-to-analog converter (DAC) analog signals, wherein each DAC analog signal is based on the reference voltage; and a means for generating digital bits, comprising a plurality of means for comparing values in parallel, wherein each means for comparing values in parallel comprises:

a number of means for comparing, wherein:

the number of means for comparing each means for comparing values in parallel is equal to two (2) raised to a number of digital bits of the corresponding means for comparing values in parallel, quantity minus one (1); and each means for comparing is configured to:

receive an analog input signal;

receive a corresponding DAC analog signal; and generate a digital signal, wherein:

the digital signal has a logic high value if the analog input signal has a greater voltage than the corresponding DAC analog signal; and the digital signal has a logic low value if the analog input signal has a smaller voltage than the corresponding DAC analog signal;

wherein:

the means for generating digital bits configured to generate one or more digital bits corresponding to each means for comparing values in parallel, wherein the one or more digital bits collectively generate a digital output signal that is a digital representation of the analog input signal;

wherein the means for converting the digital value into the analog value comprises a multiple-output means for converting a digital value into an analog value comprising a plurality of DAC stages, wherein:

each DAC stage of the plurality of DAC stages corresponds to the means for comparing values in parallel; and each DAC stage of the plurality of DAC stages is configured to:

receive a corresponding top voltage and a corresponding bottom voltage, wherein a voltage range of the corresponding top voltage and the corresponding bottom voltage is based on the reference voltage; and generate a number of DAC analog signals based on the corresponding top voltage and the corresponding bottom voltage, wherein the number of DAC analog signals is equal to the number of means for comparing in the corresponding means for comparing values in parallel.

18. The multiple-bit parallel SA Flash ADC circuit of claim 17, wherein a compare circuit further comprising a thermometer-to-binary (TTB) circuit, configured to:

receive the digital signals from one or more comparator circuits of each parallel comparator stage of the plurality of parallel comparator stages; and generate the one or more digital bits corresponding to each parallel comparator stage, wherein the one or more digital bits collectively generate the digital output signal that is the digital representation of the analog input signal.

19. The multiple-bit parallel SA Flash ADC circuit of claim 17, wherein the number of DAC analog signals generated by each DAC stage of the plurality of DAC stages has a value that is a division of the voltage range.

20. The multiple-bit parallel SA Flash ADC circuit of claim 17, wherein each DAC stage of the plurality of DAC stages comprises a means for dividing a voltage configured to generate the corresponding number of DAC analog signals by generating divisions of the voltage range.

21. A method for converting an analog input signal into a digital output signal, wherein multiple digital bits of the digital output signal are determined in parallel, comprising:

receiving a reference voltage;

generating a plurality of digital-to-analog converter (DAC) analog signals, wherein each DAC analog signal is based on the reference voltage;

receiving the analog input signal;

generating one or more digital signals in a plurality of parallel comparator stages, wherein:

each digital signal is generated by comparing the analog input signal to a corresponding DAC analog signal;

each digital signal has a logic high value if the analog input signal has a greater voltage than the corresponding DAC analog signal; and each digital signal has a logic low value if the analog input signal has a smaller voltage than the corresponding DAC analog signal;

generating one or more digital bits corresponding to each parallel comparator stage based on the one or more digital signals of the corresponding parallel comparator stage, wherein the one or more digital bits collectively generate a digital output signal that is a digital representation of the analog input signal;

receiving a corresponding top voltage and a corresponding bottom voltage, wherein a voltage range of the corresponding top voltage and the corresponding bottom voltage is based on the reference voltage; and generating a number of DAC analog signals based on the corresponding top voltage and the corresponding bottom voltage, wherein the number of DAC analog signals is equal to a number of digital signals.

22. The method of claim 21, wherein the number of DAC analog signals has a value that is a division of the voltage range.

* * * * *